United States Patent
Yoon et al.

(10) Patent No.: US 9,354,259 B2
(45) Date of Patent: May 31, 2016

(54) WIRELESS ENERGY TRANSMISSION APPARATUS AND METHOD, AND WIRELESS ENERGY RECEPTION APPARATUS

(71) Applicant: Samsung Electronics Co., Ltd., Suwon-si (KR)

(72) Inventors: Seung Keun Yoon, Seoul (KR); Ui Kun Kwon, Hwaseong-si (KR); Sang Joon Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 601 days.

(21) Appl. No.: 13/865,466

(22) Filed: Apr. 18, 2013

(65) Prior Publication Data

US 2013/0278072 A1    Oct. 24, 2013

(30) Foreign Application Priority Data

Apr. 19, 2012 (KR) .................. 10-2012-0041056

(51) Int. Cl.
*H04B 5/00* (2006.01)
*G01R 21/00* (2006.01)
*H02J 17/00* (2006.01)
(Continued)

(52) U.S. Cl.
CPC ............ *G01R 21/00* (2013.01); *H02J 5/005* (2013.01); *H02J 7/025* (2013.01); *H02J 17/00* (2013.01); *H04B 5/0037* (2013.01)

(58) Field of Classification Search
CPC .......... H02J 17/00; H02J 5/005; H02J 7/025; H02J 3/01; H01F 38/14; B60L 11/182; B60L 11/1829; B60L 11/1831; Y02T 90/122; H04B 5/0037
See application file for complete search history.

(56) References Cited

U.S. PATENT DOCUMENTS

| 7,120,245 | B2 | 10/2006 | Knubben et al. | |
| 8,004,235 | B2* | 8/2011 | Baarman | H02J 7/025 320/108 |
| 2007/0228833 | A1* | 10/2007 | Stevens | H02J 5/005 307/45 |

(Continued)

FOREIGN PATENT DOCUMENTS

| CN | 1520666 A | 8/2004 |
| CN | 102292896 A | 12/2011 |

(Continued)

OTHER PUBLICATIONS

International Search Report issued Jul. 25, 2013, in counterpart International Application No. PCT/KR2013/003053 (3 pages, in English).

(Continued)

*Primary Examiner* — Kenneth B Wells
*Assistant Examiner* — Rafael Pacheco
(74) *Attorney, Agent, or Firm* — NSIP Law

(57) ABSTRACT

A wireless energy transmission apparatus wirelessly transmits energy through resonance between a source resonator and a target resonator. The apparatus scans an amount of energy stored in the source resonator for a scanning period, calculates a total amount of energy stored in the source resonator and the target resonator during an off-resonant interval between the source resonator and the target resonator based on the amount of energy scanned, and estimates an amount of energy induced in the target resonator based on the amount of energy stored in the source resonator and the total amount of energy calculated.

30 Claims, 17 Drawing Sheets

(51) Int. Cl.
*H02J 5/00* (2016.01)
*H02J 7/02* (2016.01)

(56) References Cited

U.S. PATENT DOCUMENTS

| | | | |
|---|---|---|---|
| 2010/0181961 A1 | 7/2010 | Novak et al. | |
| 2011/0089769 A1 | 4/2011 | Kwon et al. | |
| 2011/0241438 A1 | 10/2011 | Kim et al. | |
| 2011/0244913 A1* | 10/2011 | Kim | H04B 5/0037 455/522 |
| 2011/0291489 A1 | 12/2011 | Tsai et al. | |
| 2012/0049861 A1 | 3/2012 | Kim et al. | |

FOREIGN PATENT DOCUMENTS

| | | |
|---|---|---|
| JP | 7-170668 A | 7/1995 |
| JP | 10-145987 A | 5/1998 |
| JP | 2010-239769 A | 10/2010 |
| JP | 2010-239777 A | 10/2010 |
| JP | 2010-239816 A | 10/2010 |
| JP | 2011-41464 A | 2/2011 |
| JP | 2011-166883 A | 8/2011 |
| JP | 2011-211896 A | 10/2011 |
| KR | 10-2010-0072664 A | 6/2010 |
| KR | 10-2010-0098715 A | 9/2010 |
| KR | 10-2010-0110356 A | 10/2010 |
| KR | 10-2011-0009227 A | 1/2011 |
| KR | 10-2011-0036639 A | 4/2011 |
| KR | 10-2011-0051272 A | 5/2011 |
| KR | 10-2011-0071031 A | 6/2011 |
| KR | 10-2011-0094382 A | 8/2011 |
| KR | 10-2011-0108598 A | 10/2011 |
| KR | 10-2011-0112921 A | 10/2011 |
| KR | 10-2011-0117732 A | 10/2011 |
| KR | 10-2011-0120068 A | 11/2011 |
| KR | 10-2012-0009960 A | 2/2012 |
| WO | WO 2011/124251 A1 | 10/2011 |

OTHER PUBLICATIONS

Extended European Search Report issued on Dec. 21, 2015 in counterpart European Patent Application No. 13778098.7 (7 pages, in English).

Chinese Office Action issued on Apr. 14, 2016 in counterpart Chinese Patent Application No. 201380020730.1 (31 pages, with English translation).

\* cited by examiner

WIRELESS ENERGY TRANSMISSION APPARATUS AND METHOD, AND WIRELESS ENERGY RECEPTION APPARATUS

CROSS-REFERENCE TO RELATED APPLICATION(S)

This application claims the benefit under 35 USC 119(a) of Korean Patent Application No. 10-2012-0041056 filed on Apr. 19, 2012, in the Korean Intellectual Property Office, the disclosure of which is incorporated herein by reference in its entirety for all purposes.

BACKGROUND

1. Field

The following description relates to an apparatus and a method for transmitting energy wirelessly.

2. Description of Related Art

A number of various types of mobile devices, for example, smart phones, tablet computers, and laptop computers, has been increasing. Also, with the development of near-field communication, for example, wireless local area network (WLAN) and Bluetooth, a number of systems for implementing and operating a single application in a plurality of mobile devices, as well as exchanging information between mobile devices of the same user or a plurality of users, is increasing. Most systems include mobile devices. Since mobile devices are currently faced with a limitation of a charging capacity of a battery, the battery needs to be charged more frequently than before. As one of the solutions for resolving this issue, wireless power transmission has recently been attracting more attention.

SUMMARY

In one general aspect, a wireless energy transmission apparatus for wirelessly transmitting energy through resonance between a source resonator and a target resonator includes a scanning unit configured to scan an amount of energy stored in the source resonator for a scanning period; and an induced energy estimating unit configured to calculate a total amount of energy stored in the source resonator and the target resonator during an off-resonant interval between the source resonator and the target resonator based on the amount of energy scanned by the scanning unit, and estimate an amount of energy induced in the target resonator based on the amount of energy stored in the source resonator and the total amount of energy calculated.

The resonance between the source resonator and the target resonator may be mutual resonance between the source resonator and the target resonator.

The scanning period may correspond to a number of samples and a sample length.

The induced energy estimating unit may include a transmitting end energy calculating unit configured to calculate the amount of energy stored in the source resonator per sample unit time for each of the samples based on the amount of energy scanned; a total energy calculating unit configured to calculate a greatest amount of energy among the amounts of energy calculated for each of the samples in the off-resonant interval, and determine the greatest amount of energy to be a total amount of energy stored in the source resonator and the target resonator at a predetermined time; and a receiving end energy estimating unit configured to estimate, for each of the samples, an amount of energy having a greatest difference between the total amount of energy calculated by the total energy calculating unit and the amount of energy stored in the source resonator calculated by the transmitting end energy calculating unit to be the amount of energy induced in the target resonator.

The apparatus may further include a control unit configured to determine whether the target resonator is present and receiving energy from the source resonator based on a distribution of the amount of induced energy estimated for each of the samples by the receiving end energy estimating unit.

The control unit may be further configured to determine whether a first receiving end switch configured to change a resonant frequency of the target resonator is active based on the distribution of the amount of induced energy estimated for each of the samples by the receiving end energy estimating unit.

The control unit may be further configured to control operation of a first transmitting end switch to connect the source resonator to a power source configured to supply the source resonator with energy based on the amount of induced energy estimated for each of the samples by the receiving end energy estimating unit.

The control unit may include a measuring unit configured to measure an interval in which a maximum amount of induced energy estimated for each of the samples by the receiving end energy estimating unit is maintained when the first receiving end switch is determined to be active; a first determining unit configured to determine an operating time of the first transmitting end switch based on a last sample in the interval in which the maximum amount of induced energy is maintained and the sample length; and a second determining unit configured to determine an operating cycle of the first transmitting end switch to have a same value as an operating cycle of the first receiving end switch.

The control unit may be further configured to control the first transmitting end switch to connect the source resonator to the power source before the operating time of the first transmitting end switch determined by the first determining unit; and control the first transmitting end switch to disconnect the source resonator from the power source at the operating time of the first transmitting end switch.

The control unit may include a first determining unit configured to determine an operating time of the first transmitting end switch to be an arbitrary sample start time, and an operating cycle of the first transmitting end switch to be a predetermined operating cycle, when the first receiving end switch is determined to be inactive.

The control unit may further include a second determining unit configured to determine a time when the amount of energy scanned by the scanning unit is a minimum to be an operating time of a second transmitting end switch configured to change a resonant frequency of the source resonator.

The second determining unit may be further configured to determine an earliest time the amount of energy scanned is a minimum to be the operating time of the second transmitting end switch when there are a plurality of times the amount of energy scanned is a minimum.

The control unit may be further configured to control the first transmitting end switch to connect the source resonator to the power source before the operating time of the first transmitting end switch determined by the first determining unit; control the first transmitting end switch to disconnect the source resonator from the power source at the operating time of the first transmitting end switch; control the second transmitting end switch to disconnect the source resonator from an impedance configured to change the resonant frequency of the source resonator at the operating time of the first transmitting end switch; and control the second transmitting end switch to connect the source resonator to the impedance configured to change the resonant frequency of the source resonator at the operating time of the second transmitting end switch determined by the second determining unit.

A value obtained by adding an operating cycle of a first receiving end switch configured to change a resonant frequency of the target resonator to an integer multiple of a sample unit time may be determined to be the sample length; and a value obtained by dividing the operating cycle of the first receiving end switch by the integer multiple of the sample unit time may be determined to be the number of samples.

In another general aspect, a wireless energy transmission apparatus including a source resonator configured to wirelessly transmit energy to and receive energy from a target resonator through resonance between the source resonator and the target resonator includes a scanning unit configured to scan an amount of energy stored in the source resonator for a scanning period; and a control unit configured to change a resonant frequency of the source resonator at a time when the amount of energy scanned reaches a predetermined reference value.

The resonance between the source resonator and the target resonator may be mutual resonance between the source resonator and the target resonator.

The scanning period may correspond to a number of samples; the scanning unit may be further configured to scan the amount of energy stored in the source resonator for each of the samples; and the control unit may be further configured to change a resonant frequency of the source resonator at a time when the amount of energy scanned for each of the samples reaches a predetermined reference value.

The control unit may be further configured to change the resonant frequency of the source resonator at an earliest time the amount of energy scanned reaches the predetermined reference value when the amount of energy scanned reaches the predetermined reference value a plurality of times in one sample.

In another general aspect, a wireless energy reception apparatus includes a receiving unit configured to receive wireless energy from a source resonator through resonance between the source resonator and a target resonator; and a control unit configured to determine whether the source resonator is present based on whether the receiving unit receives the wireless energy, and control operation of a first receiving end switch and a second receiving end switch by determining whether an amount of energy stored in a load is less than a predetermined threshold.

The resonance between the source resonator and the target resonator may be mutual resonance between the source resonator and the target resonator.

When the amount of energy stored in the load is greater than the predetermined threshold, the control unit may be further configured to control, during an off-resonant interval, the first receiving end switch to connect the target resonator to an impedance configured to change a resonant frequency of the target resonator, and control the second receiving end switch to connect the target resonator to the load; and control, during a resonant interval, the first receiving end switch to disconnect the target resonator from the impedance configured to change the resonant frequency of the target resonator, and control the second receiving end switch to disconnect the target resonator from the load.

When the amount of energy stored in the load is less than or equal to the predetermined threshold, the control unit may be further configured to control the first receiving end switch to disconnect the target resonator from the impedance configured to change the resonant frequency of the target resonator, and control the second receiving end switch to connect the target resonator to the load.

In another general aspect, a wireless energy transmission method for wirelessly transmitting energy through resonance between a source resonator and a target resonator includes scanning an amount of energy stored in the source resonator for a scanning period; calculating a total amount of energy stored in the source resonator and the target resonator during an off-resonant interval between the source resonator and the target resonator based on the amount of energy scanned; and estimating an amount of energy induced in the target resonator based on the amount of energy stored in the source resonator and the total amount of energy calculated.

The resonance between the source resonator and the target resonator may be mutual resonance between the source resonator and the target resonator.

The scanning period may correspond to a number of samples and a sample length.

The estimating of the amount of energy may include calculating the amount of energy stored in the source resonator per sample unit time for each of the samples based on the amount of energy scanned; calculating a greatest amount of energy among the amounts of energy calculated for the samples in the off-resonant interval; determining the greatest amount of energy to be a total amount of energy stored in the source resonator and the target resonator at a predetermined time; and estimating, for each of the samples, an amount of energy having a greatest difference between the total amount of energy calculated and the amount of energy stored in the source resonator to be an amount of energy induced in the target resonator.

In another general aspect, a wireless energy transmission apparatus for wirelessly transmitting energy through resonance between a source resonator and a target resonator includes an induced energy estimating unit configured to estimate an amount of energy induced in the target resonator during the resonance between the source resonator and the target resonator; and a control unit configured to synchronize an operation of a transmitting end switch configured to connect the source resonator to a power source configured to supply power to the source resonator with an operation of a receiving end switch configured to connect the target resonator to a load based on the estimated amount of energy induced in the target resonator.

The resonance between the source resonator and the target resonator may be mutual resonance between the source resonator and the target resonator.

The control unit may be further configured to determine an interval in which the estimated amount of energy induced in the target resonator is a maximum; determine an operating time of the transmitting end switch based on an elapsed time between a start time of the determining of the interval and an end of the interval; and determine a length of an operating cycle of the transmitting end switch to be equal to a length of an operating cycle of the receiving end switch.

The control unit may be further configured to synchronize the operation of the transmitting end switch with an operation of a receiving end switch configured to change a resonant frequency of the target resonator based on the estimated amount of energy induced in the target resonator.

Other features and aspects will be apparent from the following detailed description, the drawings, and the claims.

BRIEF DESCRIPTION OF THE DRAWINGS

FIG. 18 is a graph illustrating an example of a change in energy at a transmitting end of a wireless energy transmission and reception system when off-resonance occurs due to a switch of the transmitting end being turned on.

FIG. 19 is a graph illustrating an example of a change in energy at a receiving end of a wireless energy transmission and reception system when off-resonance occurs due to a switch of a transmitting end being turned on.

DETAILED DESCRIPTION

Figure 1:
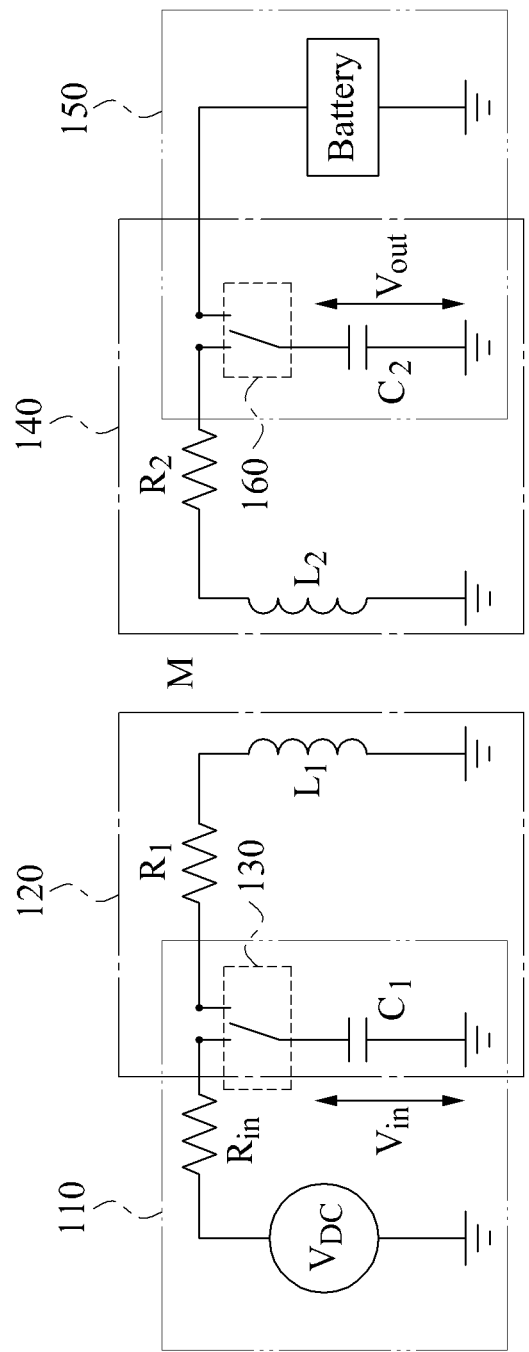
FIG. 1 is a diagram illustrating an example of an equivalent circuit of a wireless energy transmission and reception system in which a power input unit and a power transmitting unit are physically separated by a capacitor and a switch, and a receiving unit and a power output unit are physically separated by a capacitor and a switch.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, description of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

In the following description, the expression "turning on a switch" refers to closing the switch to connect a first element to a second element, and the expressing "turning off a switch" refers to opening the switch to disconnect the first element from the second element. Thus, the switch is turned on when it is closed, and is turned off when it is open. Also, when a switch is described as "active," this indicates that the switch is turned on or closed, and when the switch is described as "inactive," this indicates that the switch is turned of or open. The switch may be a mechanical switch or an electronic switch.

Near-field wireless power transmission and reception are wireless power transmission and reception that occur when a distance between a transmitting coil and a receiving coil used in transmitting and receiving power is sufficiently shorter than a wavelength at an operating frequency. A wireless power transmission and reception system using resonance properties include a source to supply power and a target to receive power.

A wireless energy transmission and reception system may be used for controlling an information storage apparatus without a power source remotely. The wireless energy transmission and reception system may be applied to a system for wirelessly loading information stored in an information storage apparatus as well as supplying power to operate the information storage apparatus remotely.

The wireless energy transmission and reception system store energy from a power supplier in a source resonator for signal generation, and induce self-resonance of the source resonator by turning off a switch electrically connecting the power supplier to the source resonator. When a target resonator having the same resonant frequency as the source resonator is present at a sufficiently short distance to enable mutual resonance with the source resonator capable of self-resonance, mutual resonance between the source resonator and the target resonator will occur.

The source resonator may correspond to a resonator for receiving energy from the power supplier, and the target resonator may correspond to a resonator to receive energy from the source resonator by mutual resonance.

FIG. 1 is a diagram illustrating an example of an equivalent circuit of a wireless energy transmission and reception system in which a power input unit and a power transmitting unit are physically separated by a capacitor and a switch, and a receiving unit and a power output unit are physically separated by a capacitor and a switch. Referring to FIG. 1, the wireless energy transmission and reception system has a source-target structure including a source and a target. The wireless energy transmission and reception system include a wireless energy transmission apparatus corresponding to the source and a wireless energy reception apparatus corresponding to the target. An amount of wireless energy corresponds to a value obtained by integrating an amount of wireless power for a predetermined period, and accordingly wireless energy transmission and reception correspond to wireless power transmission and reception.

The wireless energy transmission apparatus includes a power input unit 110, a power transmitting unit 120, and a switch unit 130. Using a power supplier, the power input unit 110 stores an amount of energy in a capacitor C. The switch unit 130 connects the capacitor $C_1$ to the power input unit 110 while an amount of energy is being stored in the capacitor $C_1$, and connects the capacitor $C_1$ to the power transmitting unit 120 while an amount of energy stored in the capacitor $C_1$ is being discharged. The switch unit 130 prevents concurrent connection of the capacitor $C_1$ to the power input unit 110 and the power transmitting unit 120.

The power transmitting unit 120 transmits an amount of electromagnetic energy to the receiving unit 140 through mutual resonance. That is, a transmitting coil $L_1$ of the power transmitting unit 120 transmits an amount of power to a receiving coil $L_2$ of the receiving unit 140 through mutual resonance. A degree of mutual resonance between the transmitting coil $L_1$ and the receiving coil $L_2$ is influenced by a mutual inductance M between the transmitting coil $L_1$ and the receiving coil $L_2$.

The power transmitting unit 120 quantizes and transmits an amount of energy stored in the capacitor $C_1$ per symbol. That is, the power transmitting unit 120 transmits information with a varying amount of energy transmitted per symbol. As used herein, a symbol refers to one bit of information transmitted between a source and a target. That is, the symbol corresponds to a period in which an amount of energy is charged in the capacitor $C_1$ and discharged once through operation of the switch unit 130.

The power input unit 110 is modeled as an input voltage $V_{DC}$, an internal resistance $R_{in}$, and a capacitor $C_1$, the power transmitting unit 120 is modeled as basic circuit devices $R_1$, $L_1$, and $C_1$ configuring a source resonator, and the switch unit 130 is modeled as at least one switch. The switch may include, for example, a passive device performing on and off functions. $R_1$ corresponds to a resistance component of the source resonator, $L_1$ corresponds to an inductor component of the source resonator, and $C_1$ corresponds to a capacitor component of the source resonator. A voltage applied to the capacitor $C_1$ is indicated as V.

The wireless energy reception apparatus includes a receiving unit 140, a power output unit 150, and a switch unit 160. The receiving unit 140 receives an amount of electromagnetic energy from the power transmitting unit 120. The receiving unit 140 stores the received amount of electromagnetic energy in a capacitor $C_2$. The switch unit 160 connects the capacitor $C_2$ to the receiving unit 140 while an amount of energy is being stored in the capacitor $C_2$, and connects the capacitor $C_2$ to the power output unit 150 while an amount of energy stored in the capacitor $C_2$ is being transmitted to a load. The load includes, for example, a battery. The switch unit 160 prevents concurrent connection of the capacitor $C_2$ to the receiving unit 140 and the power output unit 150.

That is, a receiving coil $L_2$ of the receiving unit 140 receives an amount of power from a transmitting coil $L_1$ of the power transmitting unit 120 through mutual resonance between the transmitting coil $L_1$ and the receiving coil $L_2$. The capacitor $C_2$ connected to the receiving coil $L_2$ is charged with the received amount of power. The power output unit 150 transmits the amount of power charged in the capacitor $C_2$ to a battery. Alternatively, the power output unit 150 may transmit an amount of power to a target device requiring a load or power instead of to the battery.

The receiving unit 140 receives an amount of energy from the power transmitting unit 120 per symbol, and demodulates information transmitted from the source based on the received amount of energy.

The receiving unit 140 is modeled as basic circuit devices $R_2$, $L_2$, and $C_2$ configuring a target resonator, the power output unit 150 is modeled as a capacitor $C_2$ and a battery, and the switch unit 160 is modeled as at least one switch. A voltage applied to the capacitor $C_2$ is denoted as $V_{out}$.

The wireless energy transmission and reception system in which the power input unit 110 is physically separated from the power transmitting unit 120, and the receiving unit 140 is physically separated from the power output unit 150, is known as a resonator isolation (RI) system, and has many advantages when compared to a conventional system using impedance matching. First, since power is supplied directly from a direct current (DC) power source to a source resonator, the need for a power amplifier may be eliminated. Secondly, since energy is captured from power charged in a capacitor $C_2$ of a receiver, the need for rectification through a rectifier may be eliminated. Thirdly, with the need for impedance matching being eliminated, an energy transmission efficiency is not affected by changes in a distance between a transmitter and a receiver. Also, expansion may be easily implemented from a wireless energy transmission and reception system including a single transmitter and a single receiver to a wireless energy transmission and reception system including a plurality of transmitters and a plurality of receivers.

Figure 2:
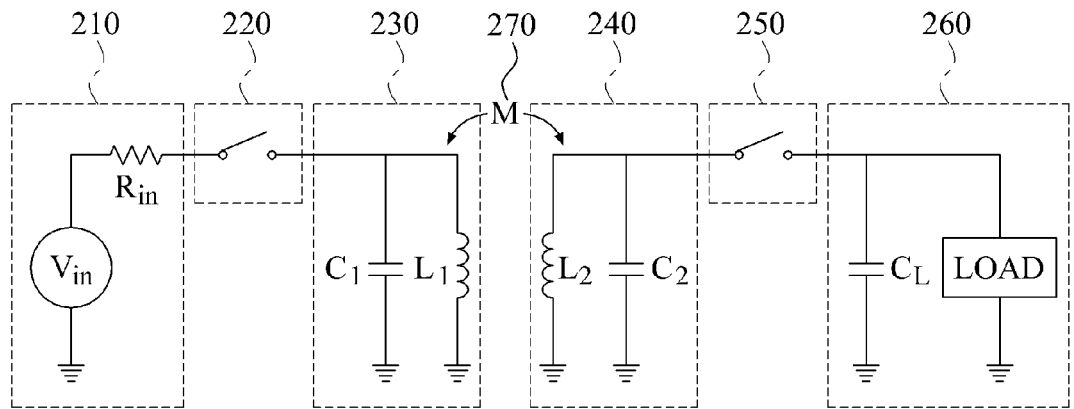
FIG. 2 is a diagram illustrating an example of an equivalent circuit of a wireless energy transmission and reception system in which a power charging unit and a transmitting unit are physically separated by a capacitor and a switch, and a charging unit and a power output unit are physically separated by a switch.

FIG. 2 is a diagram illustrating an example of an equivalent circuit of a wireless energy transmission and reception system in which a power charging unit and a transmitting unit are physically separated by a switch, and a charging unit and a power output unit are physically separated by a switch. Referring to FIG. 2, the wireless energy transmission and reception system has a source-target structure including a source and a target. That is, the wireless energy transmission and reception system includes a wireless energy transmission apparatus corresponding to the source and a wireless energy reception apparatus corresponding to the target.

The wireless energy transmission and reception system includes a power charging unit 210, a control unit 220, and a transmitting unit 230. The power charging unit 210 includes a power supplier $V_{in}$ and a resistance $R_{in}$. A source resonator operating as the transmitting unit 230 includes a capacitor $C_1$ and an inductor $L_1$. The transmitting unit 230 transmits an amount of energy stored in the source resonator to a target resonator through mutual resonance between the source resonator and the target resonator. The control unit 220 turns on a switch to supply power from the power charging unit 210 to the source resonator. A voltage is applied from the power supplier $V_{in}$ to the capacitor $C_1$ and an electric current is applied to the inductor $L_1$. When the source resonator reaches a steady state due to the voltage applied from the power supplier $V_{in}$, the voltage applied to the capacitor $C_1$ is '0' and the electric current flowing through the inductor $L_1$ has a value of $V_{in}/R_{in}$. In the steady state, the inductor $L_1$ is charged with power through the applied electric current.

When power charged in the source resonator reaches a predetermined value in the steady state, the control unit 220 turns off the switch. Information about the predetermined value may be set by the control unit 220. The power charging unit 210 and the transmitting unit 230 are separated when the control unit 220 turns off the switch. When the power charging unit 210 and the transmitting unit 230 are separated, self-resonance occurs between the capacitor $C_1$ and the inductor $L_1$ of the source resonator. The amount of energy stored in the source resonator is transmitted to the target resonator through mutual resonance between the source resonator and the target resonator in consideration of a mutual inductance M 270 between the source resonator and the target resonator. A resonant frequency $f_1$ of the source resonator and a resonant frequency $f_2$ of the target resonator are respectively expressed by the following Equations 1 and 2, and are equal to each other as expressed by the following Equation 3.

$$f_1 = \frac{1}{2\pi\sqrt{L_1 C_1}} \tag{1}$$

$$f_2 = \frac{1}{2\pi\sqrt{L_2 C_2}} \tag{2}$$

$$f_1 = f_2 \tag{3}$$

Although Equation 3 above indicates that the resonant frequency $f_1$ of the source resonator and a resonant frequency $f_2$ of the target resonator are equal to each other, energy stored in the source resonator may still be transmitted to the target resonator even if the resonant frequency $f_1$ of the source resonator and a resonant frequency $f_2$ of the target resonator are not equal to each other, but the energy transmission efficiency may be less than when the resonant frequency $f_1$ of the source resonator and a resonant frequency $f_2$ of the target resonator are equal to each other.

The transmitting unit 230 quantizes and transmits an amount of energy stored in the source resonator per symbol. That is, the power transmitting unit 230 transmits information with an amount of energy transmitted varying per symbol. The symbol corresponds to a period in which an amount of energy is charged in the capacitor $C_1$ and the inductor $L_1$ and discharged once through operation of the switch unit 220.

The wireless energy reception apparatus includes a charging unit 240, a control unit 250, and a power output unit 260. The target resonator operating as the charging unit 240 includes a capacitor $C_2$ and an inductor $L_2$. When mutual resonance occurs between the source resonator and the target resonator, the source resonator is separated from the power supplier $V_{in}$ and the target resonator is separated from a load and a capacitor $C_L$. The capacitor $C_2$ and the inductor $L_2$ of the target resonator are charged through the mutual resonance. The control unit 250 turns off a switch to charge the target resonator with power. While the switch is turned off, mutual resonance occurs between the target resonator and the source resonator because the target resonator and the source resonator have the same resonant frequency as expressed by Equation 3 above. When an amount of power charged in the target resonator reaches a predetermined value, the control unit 250 turns on the switch. Information about the predetermined value may be set by the control unit 250. When the control unit 250 turns on the switch, the capacitor $C_L$ is connected to the charging unit 240, thereby changing the resonant frequency of the target resonator to a changed resonant frequency $f_2'$ expressed by the following Equation 4.

$$f_2' = \frac{1}{2\pi\sqrt{L_2(C_2 + C_L)}} \tag{4}$$

Since the changed resonant frequency $f_2'$ of the target resonator is no longer equal to the resonant frequency $f_1$ of the source resonator, mutual resonance between the source resonator and the target resonator stops. That is, when $f_2'$ is sufficiently smaller than $f_2$ in consideration of Q of the target resonator, a mutual resonance channel between the source resonator and the target resonator is interrupted. Also, when the control unit 250 turns on the switch, the power output unit 260 transmits an amount of power charged in the capacitor $C_2$ and the inductor $L_2$ to the load.

When an amount of power charged in the target resonator is less than the predetermined value, the control unit 250 turns off the switch, mutual resonance between the source resonator and the target resonator reoccurs, and the charging unit 240 recharges the target resonator with an amount of power through the mutual resonance between the source resonator and the target resonator.

The charging unit 240 receives an amount of energy from the transmitting unit 230 per symbol, and demodulates information transmitted from the source based on the received amount of energy.

When mutual resonance occurs between the source resonator and the target resonator, a connection between the charging unit 240 and the power output unit 260 through the switch is interrupted because the control unit 250 opens the switch. Accordingly, a reduction in an energy transmission efficiency caused by connection through the switch is prevented.

The controlling of the time of capturing energy stored in the target resonator according to FIG. 2 is easier than transmitting energy charged in the capacitor according to FIG. 1. The transmission of energy charged in the capacitor according to FIG. 1 only captures energy charged in the capacitor. However, capturing energy by changing the resonant frequency according to FIG. 2 captures energy stored in both the inductor and the capacitor of the target resonator, thereby improving freedom in controlling the energy capture time.

Figure 3:
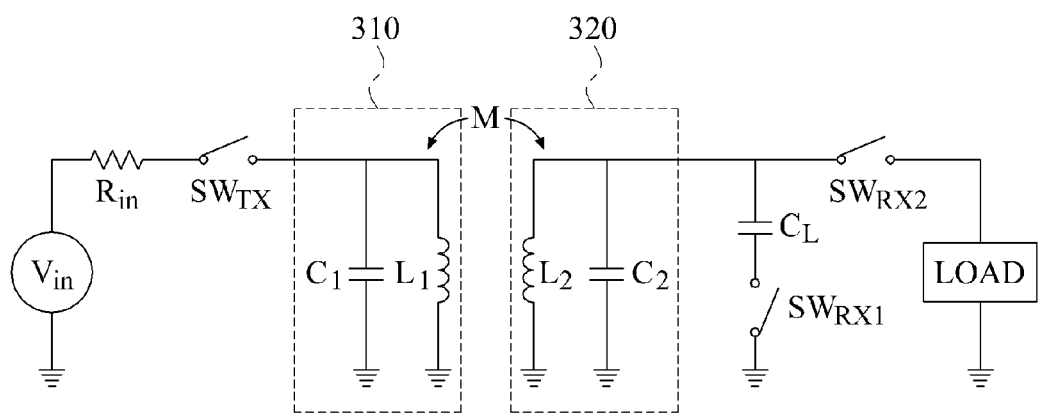
FIG. 3 is a diagram illustrating another example of an equivalent circuit of a wireless energy transmission and reception system.

FIG. 3 is a diagram illustrating another example of an equivalent circuit of a wireless energy transmission and reception system. Referring to FIG. 3, the wireless energy transmission and reception system has a source-target structure including a source and a target. That is, the wireless energy transmission and reception system include a wireless energy transmission apparatus corresponding to the source and a wireless energy reception apparatus corresponding to the target.

An energy transfer process from the wireless energy transmission apparatus to the wireless energy reception apparatus in an RI system includes the five operations described below.

In a first operation of supplying an amount of energy to the wireless energy transmission apparatus, when a source resonator 310 is connected to a power source $V_{in}$ through $SW_{TX}$, an amount of energy is supplied to the source resonator 310.

In a second operation of mutual resonance between the wireless energy transmission apparatus and the wireless energy reception apparatus, when the source resonator 310 is disconnected from the power source $V_{in}$, the source resonator 310 transmits energy to and receives energy from a target resonator 320 during a predetermined cycle through mutual resonance.

In a third operation of synchronization between the wireless energy transmission apparatus and the wireless energy reception apparatus, a start time of energy transmission and reception between the wireless energy transmission apparatus and the wireless energy reception apparatus, and cycles of $SW_{TX}$ and $SW_{RX1}$ respectively located in the wireless energy transmission apparatus and the wireless energy reception apparatus, are estimated.

In a fourth operation of off-resonance between the wireless energy transmission apparatus and the wireless energy reception apparatus, when most of the amount of energy has been transmitted to the wireless energy reception apparatus during mutual resonance, off-resonance is implemented between the wireless energy transmission apparatus and the wireless energy reception apparatus energy to disable energy retransmission from the wireless energy reception apparatus energy to the wireless energy transmission apparatus. Off-resonance is implemented by changing the resonant frequency of the source resonator and/or the target resonator.

In a fifth operation of transmitting an amount of energy induced in the wireless energy reception apparatus to a load, the target resonator 320 is connected to the load through $SW_{RX2}$ to transmit an amount of energy induced in the target resonator 320 to the load.

The wireless energy transmission and reception system of FIG. 3 includes an additional switch $SW_{RX2}$ in the target compared to the wireless energy transmission and reception system of FIG. 2. The switch $SW_{RX1}$ serves to change the resonant frequency of the target resonator 320, and the switch $SW_{RX2}$ serves to transmit an amount of energy charged in the target resonator 320 to the load.

Synchronization between $SW_{TX}$ and $SW_{RX1}$ is needed for the target resonator 310 to receive energy or data modulated using energy from the source resonator 310.

When an operating cycle of turning $SW_{RX1}$ on and off is predetermined, the wireless energy transmission apparatus may determine a turn-off time and an operating cycle of $SW_{TX}$ by estimating an amount of energy induced in the target resonator 320 through mutual resonance between the source resonator 310 and the target resonator 320.

A process of estimating an amount of energy induced in the target resonator 320 and a process of determining a turn-off time and an operating cycle of $SW_{TX}$ will now be described.

Figure 4:
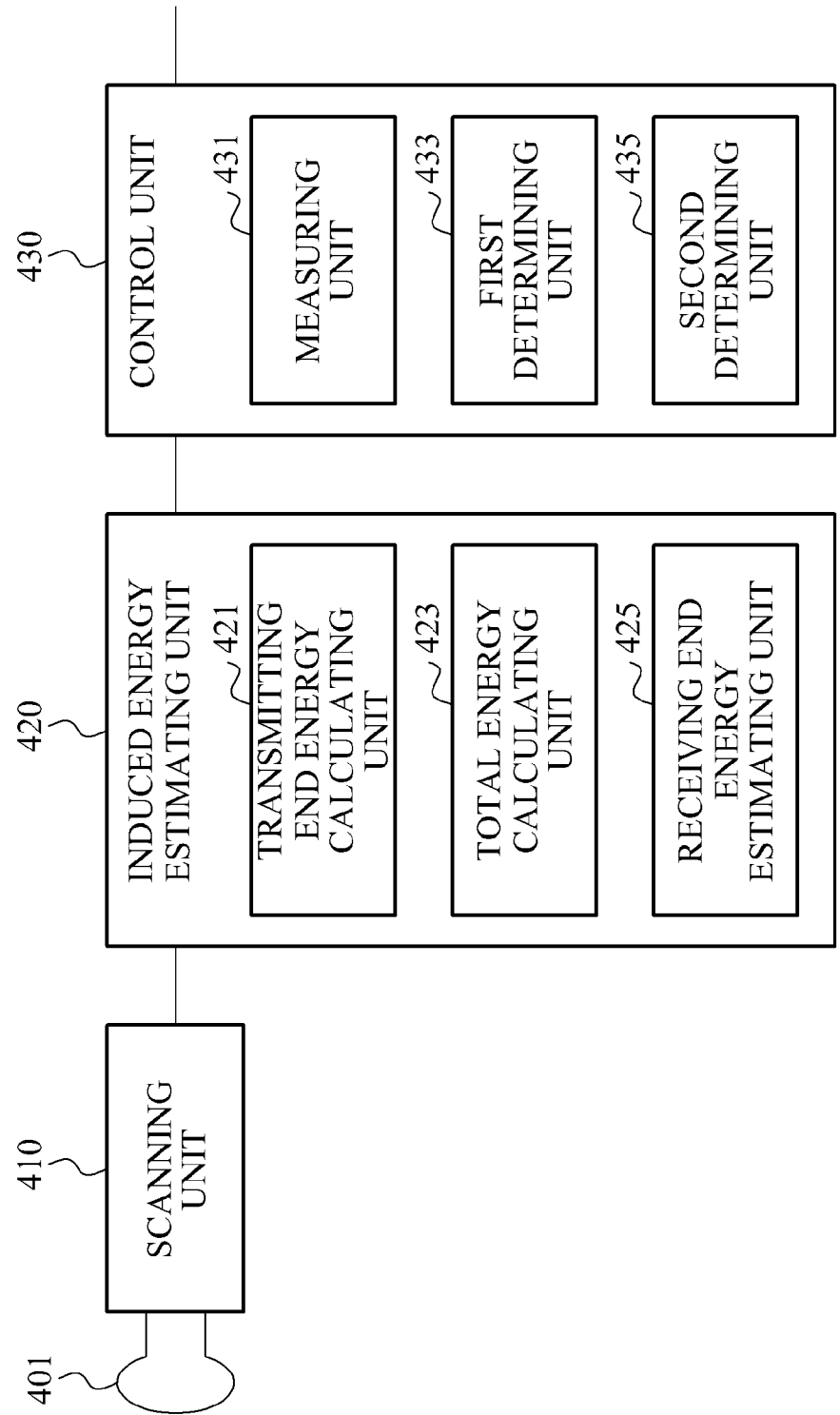
FIG. 4 is a block diagram illustrating an example of a wireless energy transmission apparatus.

FIG. 4 is a block diagram illustrating an example of a wireless energy transmission apparatus. Referring to FIG. 4, the wireless energy transmission apparatus includes a scanning unit 410, an induced energy estimating unit 420, and a control unit 430. In the following description, the wireless energy transmission apparatus may be referred to as a transmitting end, and a wireless energy reception apparatus may be referred to as a receiving end.

The scanning unit 410 scans an amount of energy stored in a source resonator 401 for a scanning period corresponding to a predetermined number of samples each having a sample length. The scanning unit 410 scans an amount of energy stored in the source resonator 401 while the amount of energy is being wirelessly transmitted from the source resonator 401 through mutual resonance between the source resonator 401 and a target resonator. The amount of energy stored in the source resonator 401 by mutual resonance is transmitted from the source resonator 401 to the target resonator, and may subsequently be retransmitted from the target resonator to the source resonator 401.

The scanning unit 410 scans an amount of energy stored in the source resonator 401 per sample. A sample is a unit of energy supplied from a power source to the source resonator 401, and corresponds to a period between one energy supply to the source resonator 101 and a next energy supply to the source resonator 401. Each sample has a predetermined period. For example, a first sample corresponds to a period between a first energy supply to the source resonator 401 and a second energy supply to the source resonator 401, a second sample corresponds to a period between the second energy supply to the source resonator 401 and a third energy supply to the source resonator 401, and so forth.

A length of a sample corresponds to a duration of the sample, that is, to a value obtained by adding an operating cycle of a receiving end switch, that is, $SW_{RX1}$ of FIG. 3, to an integer multiple of a sample unit time. The sample length may be expressed by the following Equation 5.

$$T_{Sample} = T_{RX} + sT_C \qquad (5)$$

In Equation 5, $T_{Sample}$ denotes a sample length, $T_{RX}$ denotes an operating cycle of $SW_{RX1}$ of FIG. 3, $T_C$ denotes a sample unit time, and 's' denotes an integer greater than '0'. The sample unit time corresponds to a smallest unit of time taken to process a signal in a sample.

The number of samples corresponds to the number of samples taken to estimate an amount of energy induced in the wireless energy reception apparatus from the wireless energy reception apparatus. A value obtained by dividing an operating cycle of $SW_{RX1}$ of FIG. 3 by an integer multiple of a sample unit time is determined to be the number of samples. The number of samples and a maximum number of samples may be expressed by the following Equations 6 and 7.

$$N = \frac{T_{RX}}{sT_C} \qquad (6)$$

$$N_{MAX} = \frac{T_{RX}}{T_C} \qquad (7)$$

In Equation 6, N denotes the number of samples. In Equation 7, $N_{MAX}$ denotes a maximum number of samples obtained when 's' is equal to 1. Since the number of samples used in estimating an amount of induced energy is a maximum at $N_{MAX}$, the amount of induced energy may be estimated more accurately if the number of samples is $N_{MAX}$.

The scanning unit 410 scans an amount of energy stored in the source resonator 401 for a scanning period corresponding to a product of the sample length $T_{Sample}$ and the number of samples N or $N_{MAX}$.

The number of samples increases with an increase in energy scanning time 't' starting from t=0. As a sample number N increases, a turn-on time of $SW_{RX1}$ of FIG. 3 moves up by an integer multiple of a sample unit time $sT_C$ earlier than a start time of a previous sample.

The scanning unit 410 scans an amount of energy stored in the source resonator 401 per sample at a time moved up by an integer multiple of a sample unit time $sT_C$.

The induced energy estimating unit 420 calculates a total amount of energy stored in the source resonator 401 and the target resonator during an off-resonant interval between the source resonator 401 and the target resonator based on the amount of energy scanned. The induced energy estimating unit 420 estimates an amount of energy induced in the target resonator based on the amount of energy stored in the source resonator 401 and the total amount of energy calculated.

The induced energy estimating unit 420 includes a transmitting end energy calculating unit 421, a total energy calculating unit 423, and a receiving end energy estimating unit 425.

The transmitting end energy calculating unit 421 calculates an amount of energy stored in the source resonator 401 per sample unit time of each sample based on the amount of energy scanned. $SW_{RX1}$ of FIG. 3 is turned on at different times in each sample, and accordingly off-resonance occurs at different intervals in each sample.

The total energy calculating unit 423 calculates, during an off-resonant interval, a greatest amount of energy among the amounts of energy calculated per sample, and determines the greatest amount of energy to be a total amount of energy stored in the source resonator 401 and the target resonator at a predetermined time. Since off-resonance occurs at different intervals in each sample, the greatest amount of energy is determined to be a total amount of energy per sample unit time.

The receiving end energy estimating unit 425 may estimate, in each sample, to be an amount of energy induced in the target resonator, an amount of energy having a greatest difference between the total amount of energy calculated by the total energy calculating unit 423 and the amount of energy stored in the source resonator 401, calculated by the transmitting end energy calculating unit 421.

An amount of energy induced in the receiving end, in particular, in the target resonator, at a predetermined time is calculated as a difference between a total amount of energy stored in the source resonator 401 and the target resonator at the predetermined time and an amount of energy stored in the source resonator 401 at the predetermined time. When off-resonance occurs at a predetermined time, a total amount of energy stored in the source resonator 401 and the target resonator at the predetermined time is equal to an amount of energy stored in the source resonator 401 at the predetermined time. Accordingly, during an off-resonant interval, a total amount of energy may be calculated by calculating an amount of energy stored in the source resonator 401.

The control unit 430 determines whether a target resonator receiving energy from the source resonator 401 is present based on a distribution of an amount of induced energy estimated per sample by the receiving end energy estimating unit 425. When the target resonator is present within a distance allowing mutual resonance to occur between the source resonator 401 and the target resonator, an amount of induced energy estimated per sample is estimated to have a value other than '0'. The amount of induced energy may be estimated as shown in the distribution in graphs of FIGS. 15 and 16.

The control unit 430 determines whether the receiving end switch, that is, $SW_{RX1}$ of FIG. 3 is active, based on a distribution of an amount of induced energy estimated per sample by the receiving end energy estimating unit 425. $SW_{RX1}$ of FIG. 3 changes a resonant frequency of the target resonator by connecting the target resonator to an impedance such as an inductor or a capacitor.

When $SW_{RX1}$ of FIG. 3 is active, that is, when $SW_{RX1}$ is turned on, off-resonance occurs and an estimated amount of induced energy per sample has a maximum value and a minimum value. That is, an amount of induced energy may be estimated as shown in the distribution in the graph of FIG. 15.

When $SW_{RX1}$ of FIG. 3 is inactive, that is, when $SW_{RX1}$ is turned off, continuous resonance occurs and an estimated amount of induced energy per sample may continuously have another value aside from a value of '0'. That is, an amount of induced energy may be estimated as shown on the distribution in the graph of FIG. 16.

When the receiving end switch, that is, $SW_{RX1}$ of FIG. 3 is inactive, the control unit 430 controls operation of a transmitting end switch, that is, $SW_{TX}$ of FIG. 3, based on an amount of induced energy estimated per sample by the receiving end energy estimating unit 425. The transmitting end switch electrically connects the source resonator 401 to a power source supplying the source resonator 401 with energy and electrically disconnects the source resonator 401 from the power source.

The control unit 430 includes a measuring unit 431, a first determining unit 433, and a second determining unit 435.

When $SW_{RX1}$ of FIG. 3 is determined to be active, the measuring unit 431 measures an interval in which a maximum amount of induced energy estimated per sample by the receiving end energy estimating unit 425 is maintained. The measuring unit 431 may measure an interval in which a difference between an amount of induced energy estimated per sample and a maximum amount of induced energy is less than a predetermined critical value.

The first determining unit 433 determines an operating time of the transmitting end switch based on a last sample of an interval in which a maximum amount of induced energy is maintained and a length of the sample. A sample $N_{Sync}$ immediately before the fall of an amount of induced energy after maintaining a maximum value may correspond to a sample in which operation of $SW_{RX1}$ of FIG. 3 is synchronized with energy supply of a transmitting end, that is, a sample in which a time of a maximum instantaneous energy transmission amount from the source resonator 401 is exactly matched with a turn-on time of $SW_{RX1}$. An operating time and an operating cycle of the transmitting end switch may be determined using the sample $N_{Sync}$. The first determining unit 433 determines an operating time of the transmitting end switch based on a time elapsed in $N_{Sync}*T_{Sample}$ from a scan start time of energy stored in the source resonator 401.

The second determining unit 435 determines an operating cycle of the transmitting end switch to have the same value as an operating cycle of the receiving end switch. The second determining unit 435 may determine an operating cycle of the transmitting end switch to have the same value as an operating cycle of the receiving end switch based on a time elapsed in $N_{Sync}*T_{Sample}$ from a scan start time of energy stored in the source resonator 401. This assumes that the operating cycle of the receiving end switch is already known at the transmitting end.

The control unit 430 controls the transmitting end switch before the operating time of the transmitting end switch determined by the first determining unit 433 to connect the source resonator 401 to the power source. The control unit 430 controls the transmitting end switch at the operating time of the transmitting end switch to disconnect the source resonator 401 from the power source. That is, the operating time of the transmitting end switch corresponds to a turn-off time of $SW_{TX}$ of FIG. 3.

When the receiving end switch is determined to be inactive, the first determining unit 433 determines an operating time of a first transmitting end switch to be an arbitrary sample start time, and determines an operating cycle of the first transmitting end switch to be a predetermined operating cycle. The first transmitting end switch corresponds to $SW_{TX}$ of FIG. 3.

The second determining unit 435 determines a time when the amount of energy scanned by the scanning unit 410 is a minimum to be an operating time of a second transmitting end switch of the source resonator 401. The second transmitting end switch corresponds to $SW_{TX2}$ of FIG. 20. The second determining unit 435 determines an earliest time the amount of energy scanned is a minimum to be an operating time of the second transmitting end switch when there are a plurality of times the amount of energy scanned is a minimum. The operating time of the second transmitting end switch corresponds to a turn-on time of $SW_{TX2}$ of FIG. 20. Off-resonance occurs between the source resonator 401 and the target resonator at the operating time of the second transmitting end switch so that energy stored in the target resonator is not transmitted to the source resonator 401.

The control unit 430 controls the first transmitting end switch before the operating time of the first transmitting end switch determined by the first determining unit 433 to connect the source resonator 401 to the power source. The control unit 430 controls, at the operating time of the first transmitting end switch, the first transmitting end switch to disconnect the source resonator 401 from the power source, and controls the second transmitting end switch to disconnect the source resonator 401 from an impedance changing the resonant frequency. The control unit 430 controls the second transmitting end switch at the operating time of the second transmitting end switch determined by the second determining unit 435 to connect the source resonator 401 to the impedance changing the resonant frequency.

The scanning unit 410 scans an amount of energy stored in the source resonator 401 in sample units. That is, the scanning unit 410 scans an amount of energy stored in the source resonator 401 per sample. The control unit 430 changes the resonant frequency of the source resonator 401 when an amount of energy scanned per sample reaches a predetermined reference value. The predetermined reference value may be a minimum amount among the amounts of energy scanned per sample. For example, the predetermined reference value may be '0'. The predetermined reference value may vary depending on a degree of scan precision of the scanning unit 410, or may be changed by a user.

Figure 20:
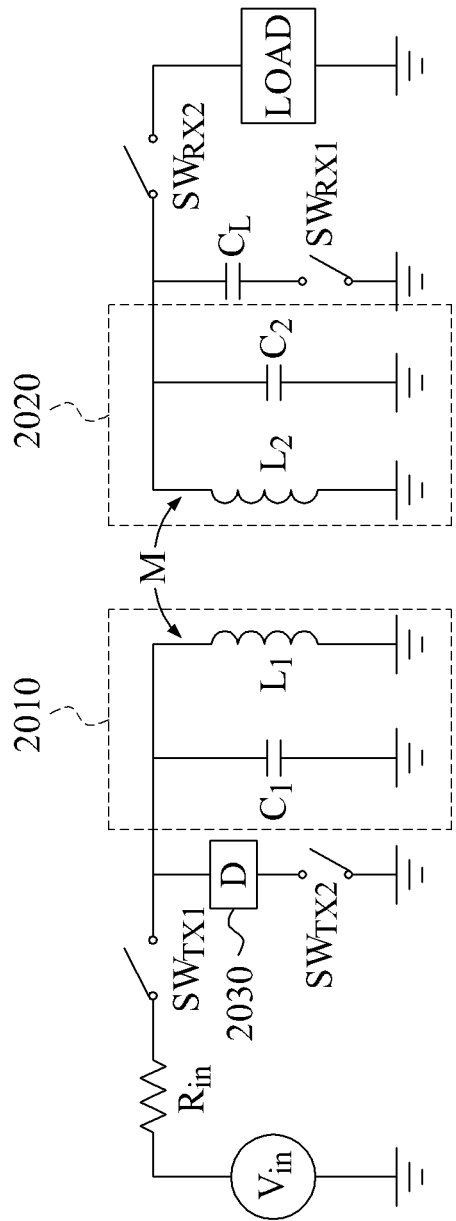
FIG. 20 is a diagram illustrating another example of an equivalent circuit of a wireless energy transmission and reception system.

The control unit 430 changes the resonant frequency of the source resonator 401 by connecting the source resonator 401 to an additional impedance indicated by 'D'. As shown in FIG. 20, the control unit 430 may connect the source resonator 401 to the additional impedance by controlling an operation of a switch $SW_{TX2}$.

The control unit 430 changes the resonant frequency of the source resonator 401 at an earliest time an amount of energy scanned in one sample reaches a predetermined reference value when there are a r plurality of times an amount of energy scanned in one sample reaches a predetermined reference value.

The control unit 430 may generally control the wireless energy transmission apparatus and may perform functions of the scanning unit 410 and the induced energy estimating unit 420. Although the example of FIG. 4 shows the scanning unit 410, the induced energy estimating unit 420, and the control unit 430 as separate components to distinguish each function, a product may actually be implemented to allow the control unit 430 to perform some or all of the functions of the scanning unit 410 and the induced energy estimating unit 420.

Figure 5:
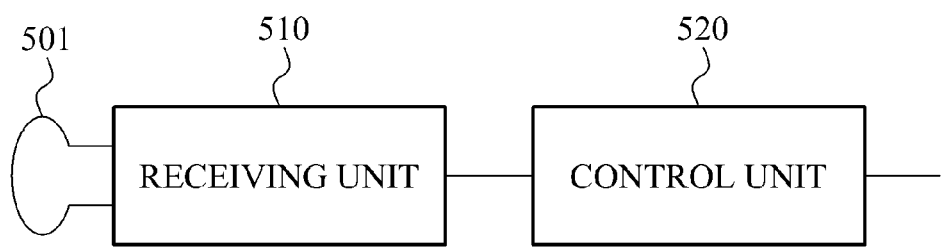
FIG. 5 is a block diagram illustrating an example of a wireless energy reception apparatus.

FIG. 5 is a block diagram illustrating an example of a wireless energy reception apparatus. Referring to FIG. 5, the wireless energy reception apparatus includes a receiving unit 510 and a control unit 520.

The receiving unit 510 receives an amount of wireless energy from a source resonator through mutual resonance between the source resonator and a target resonator 501. That is, an amount of energy is induced in the target resonator through mutual resonance between the source resonator and the target resonator 501.

The control unit 520 determines whether the source resonator is present based on whether the receiving unit 510 receives an amount of wireless energy.

The control unit 520 controls operation of a first receiving end switch and a second receiving end switch by determining whether an amount of energy stored in a load is less than a predetermined critical value. As an example, the load may include a battery. The predetermined critical value may correspond to a minimum amount of energy necessary to operate the first receiving end switch or the second receiving end switch.

When the amount of energy stored in the load is greater than the predetermined critical value, the control unit 520 controls, during an off-resonant interval, the first receiving end switch to connect the target resonator 501 to an impedance changing a resonant frequency of the target resonator 501, and controls the second receiving end switch to connect the target resonator 501 to the load to transmit the amount of energy stored in the target resonator 501 to the load. Also, the control unit 520 controls, during a resonant interval, the first receiving end switch to disconnect the target resonator 501 from the impedance changing the resonant frequency of the target resonator 501, and controls the second receiving end switch to disconnect the target resonator 501 from the load. During the resonant interval, the amount of energy is stored in the target resonator 501.

When the amount of energy stored in the load is less than or equal to the predetermined critical value, the control unit 520 controls the first receiving end switch to disconnect the target resonator 501 from the impedance changing the resonant frequency of the target resonator 501, and controls the second receiving end switch to connect the target resonator 501 to the load to transmit the amount of energy stored in the target resonator 501 to the load while continuously maintaining mutual resonance with the source resonator.

The control unit 520 may generally control the wireless energy reception apparatus and may perform a function of the receiving unit 510. Although the example of FIG. 5 shows the receiving unit 510 and the control unit 520 as separate components to distinguish each function, a product may actually be implemented to allow the control unit 520 to perform some or all functions of the receiving unit 510.

Figure 6:
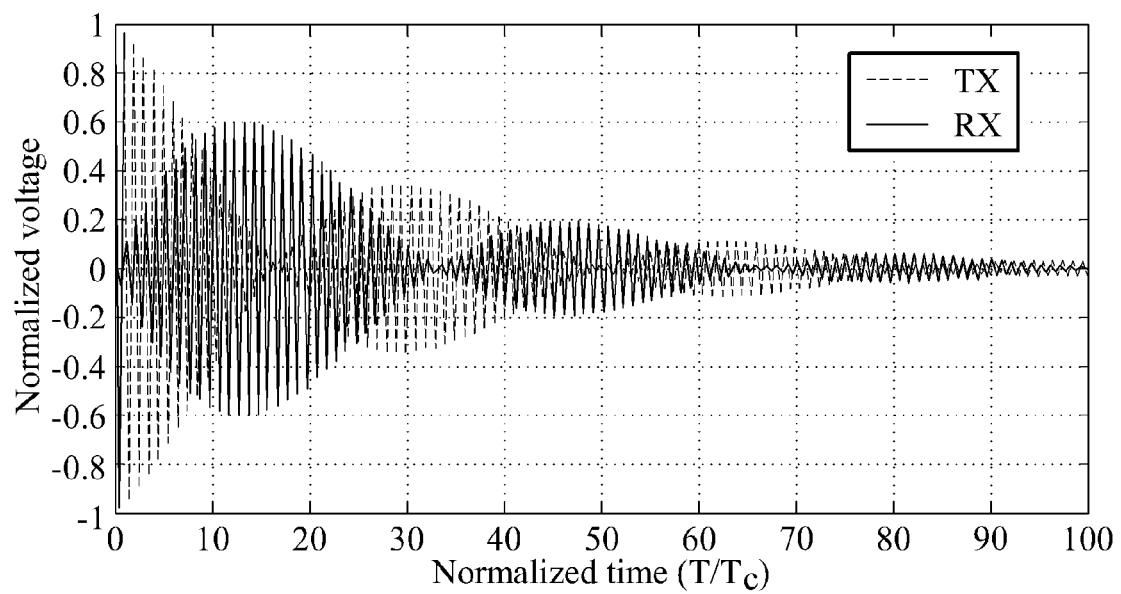
FIG. 6 is a graph illustrating an example of an amount of energy measured at a transmitting end and a receiving end of a wireless energy transmission and reception system.

FIG. 6 is a graph illustrating an example of an amount of energy measured at a transmitting end and a receiving end of a wireless energy transmission and reception system. The wireless energy transmission and reception system includes a transmitting end to transmit energy and a receiving end to receive energy through mutual resonance. The transmitting end may be referred to as TX and the receiving end may be referred to as RX.

FIG. 6 illustrates an amount of energy stored in TX and RX during mutual resonance in a state in which a source resonator of TX is physically separated from a power source and a target resonator of RX is physically separated from a load, immediately after energy from a power source is supplied to TX. The amount of energy transmitted from TX to RX through mutual resonance may be repeatedly transmitted between TX and RX in one sample.

In FIG. 6, the amount of energy stored in TX and RX is represented by a normalized voltage on a y axis of the graph. A normalized time on an x axis corresponds to a value obtained by dividing an energy measuring time by a sample unit time, and the sample unit time $T_C$ corresponds to a smallest unit of time taken to process a signal.

Figure 7:
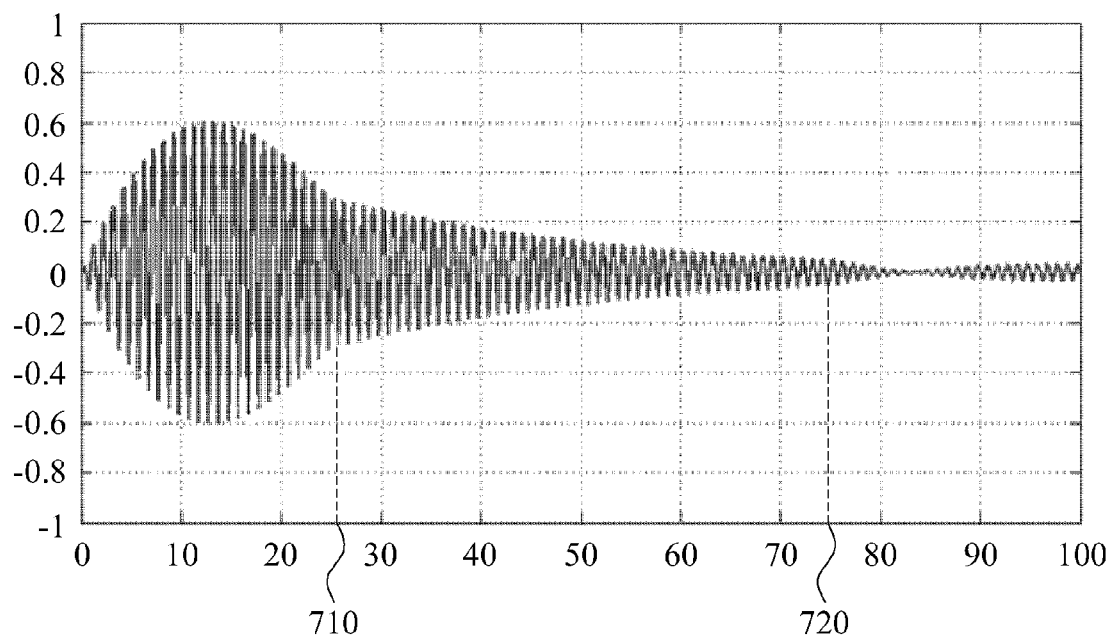
FIG. 7 is a graph illustrating an example of an amount of energy stored in a receiving end of a wireless energy transmission and reception system when off-resonance occurs at the receiving end.

FIG. 7 is a graph illustrating an example of an amount of energy stored in a receiving end of a wireless energy transmission and reception system when off-resonance occurs at the receiving end. FIG. 7 illustrates an amount of energy remaining in RX that is not transmitted to TX when off-resonance occurs due to $SW_{RX1}$ of FIG. 3 being turned on at a time 710 during mutual resonance between TX and RX.

The amount of energy remaining in RX during an off-resonant interval, that is, from the time 710 to a time 720, is determined by an amount of energy induced in RX at the time 710 when off-resonance occurs. Accordingly, to transmit a maximum possible amount of energy from RX, $SW_{RX1}$ of FIG. 3 needs to be turned on when an amount of energy induced in RX is a maximum. In a case in which $SW_{RX1}$ of FIG. 3 has a predetermined operating cycle of turn-on and turn-off, a TX switch needs to be open when an amount of energy induced in RX is a maximum. Accordingly, when a time in which an amount of energy induced in RX is a maximum is estimated at TX, the TX switch may be synchronized with the RX switch through control of the TX switch.

Figure 8A:
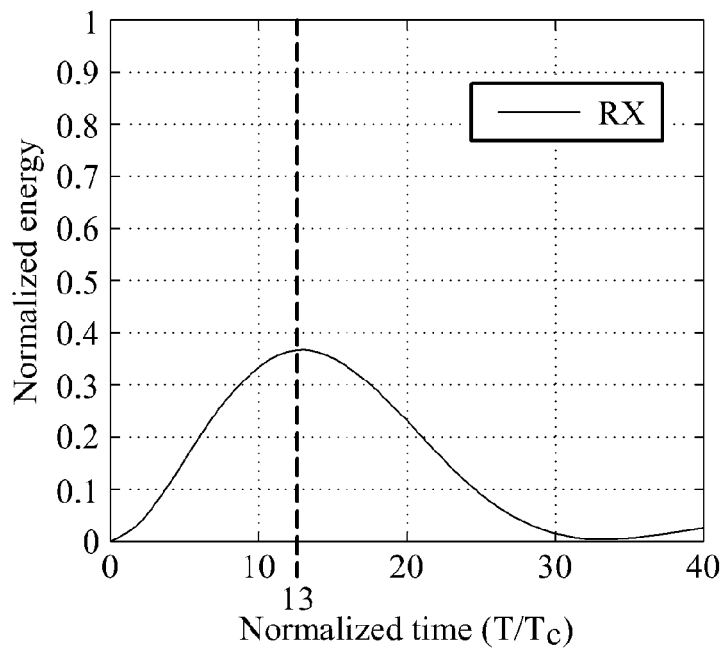
FIGS. 8A and 8B are graphs illustrating an example of a time when an amount of energy stored in a receiving end of a wireless energy transmission and reception system is a maximum during mutual resonance and an amount of energy stored in a transmitting end at the corresponding time.
Figure 8B:
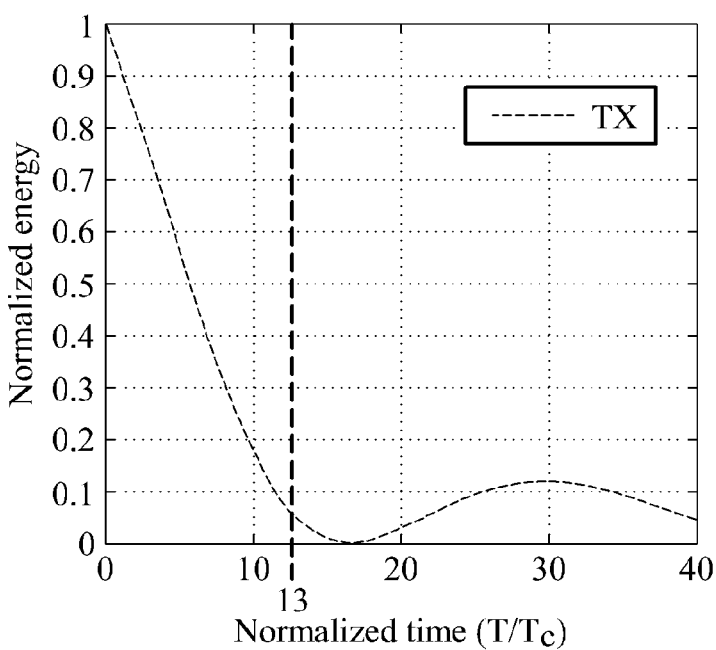

FIGS. 8A and 8B are graphs illustrating an example of a time when an amount of energy stored in a receiving end of a wireless energy transmission and reception system is a maximum during mutual resonance and an amount of energy stored in a transmitting end at the corresponding time.

FIG. 8A illustrates a change in an amount of energy stored in RX during mutual resonance between TX and RX, and FIG. 8B illustrates a change in an amount of energy stored in TX during mutual resonance between TX and RX.

In FIGS. 8A and 8B, since an amount of energy stored in TX is not a minimum at a time when an amount of energy stored in RX is a maximum, it is difficult to determine at TX a time at which an amount of energy induced in RX is a maximum.

The time inconsistency may be caused by a difference between an energy attenuation rate at RX and an energy transmission rate from TX to RX. That is, when the energy attenuation rate at RX is higher than the energy transmission rate from TX to RX, a time when an amount of energy induced in RX is a maximum may be earlier than a moment when energy is completely transmitted from TX to RX.

Figure 9:
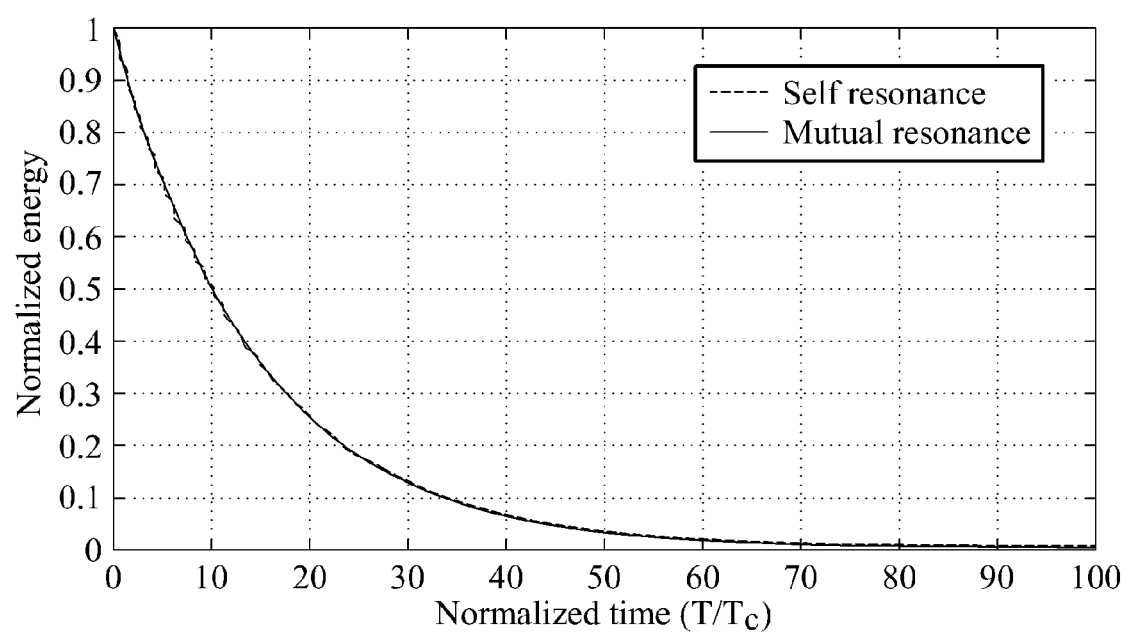
FIG. 9 is a graph illustrating an example of a total amount of energy stored in a transmitting end and a receiving end of a wireless energy transmission and reception system.

FIG. 9 is a graph illustrating an example of a total amount of energy stored in a transmitting end and a receiving end of a wireless energy transmission and reception system. Referring to FIG. 9, when mutual resonance occurs between TX and RX as well as self-resonance of TX, a total amount of energy stored in TX and RX may be uniformly reduced irrespective of a value of a mutual inductance M.

A total amount of energy stored in TX and RX at a predetermined time and an amount of energy induced from TX into RX at the corresponding time may be estimated.

Accordingly, to estimate an amount of energy induced in RX at a predetermined time, a total amount of energy stored in TX and RX may be needed as well as an amount of energy stored in TX at the corresponding time. However, the total amount of energy stored in TX and RX may be obtained by analyzing a signal of TX.

Figure 10A:
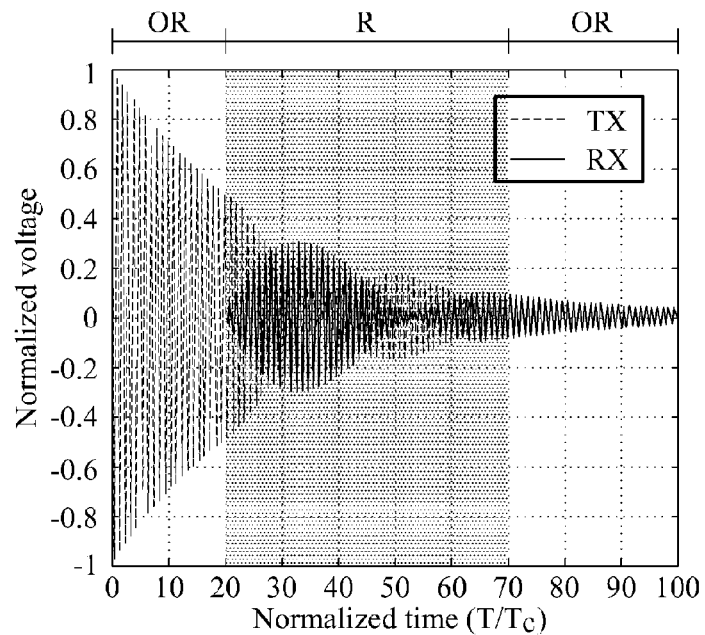
FIGS. 10A and 10B are graphs illustrating an example of an amount of energy stored in a transmitting end and a receiving end of a wireless energy transmission and reception system by operation of a switch of the receiving end.
Figure 10B:
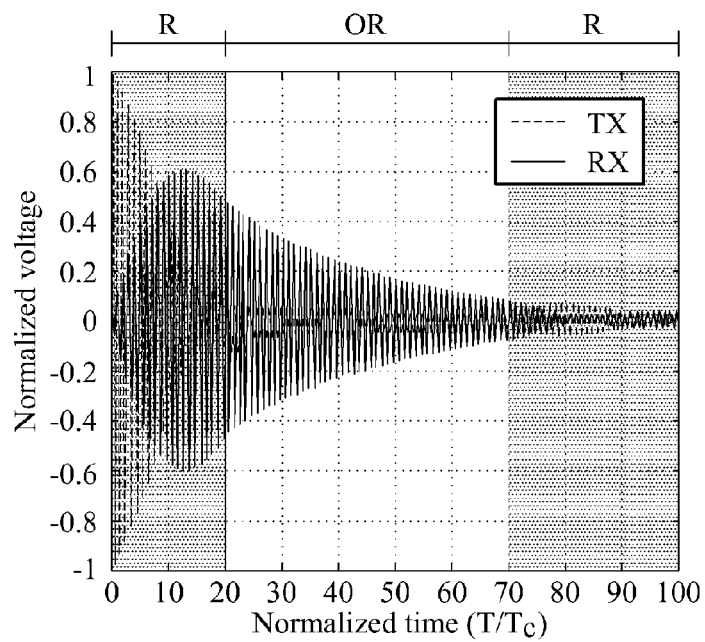

FIGS. 10A and 10B are graphs illustrating an example of an amount of energy stored in a transmitting end and a receiving end of a wireless energy transmission and reception system by operation of a switch of the receiving end.

An off-resonant interval 'OR' between TX and RX in FIG. 10A may be different from an off-resonant interval 'OR' between TX and RX in FIG. 10B. Off-resonance occurs when $SW_{RX1}$ of FIG. 3 is turned on, and may not result in energy exchange between TX and RX.

In FIG. 10A, $SW_{RX1}$ is turned off at 20 $T_C$, and is turned on at 70 $T_C$. That is, an interval between 20 $T_C$ and 70 $T_C$ indicated by hatching corresponds to a resonant interval 'R', and the remainder corresponds to an off-resonant interval 'OR'.

Referring to FIG. 10A, when an amount of energy stored in RX is '0' during an off-resonant interval between 0 and 20 $T_C$, an amount of energy stored in TX equals a total amount of energy stored in RX and TX.

In contrast to FIG. 10A, in FIG. 10B, $SW_{RX1}$ is turned on at 20 $T_C$, and is turned off at 70 $T_C$. That is, an interval between 20 $T_C$ and 70 $T_C$ corresponds to an off-resonant interval 'OR', and the remainder corresponds to a resonant interval 'R'.

In order to estimate, at TX, an amount of energy stored in RX at a predetermined time, a total amount of energy at the predetermined time is needed. Further, in order to estimate, at TX, a change in a total amount of energy, it may be convenient to measure a change in an amount of energy stored in TX during self-resonance of TX, i.e., when mutual resonance does not occur between TX and RX.

Also, when verification as to whether RX is present within a distance from TX allowing mutual resonance is impossible, a change in a total amount of energy may be verified by analyzing a signal of TX. When a sample start time is included in an off-resonant interval as shown in FIG. 10A, a scanning time in one sample extends from the sample start time to an initial end time of the off-resonant interval. When the sample start time is included in the resonant interval as shown in FIG. 10B, some amount of energy may be transmitted from TX to RX during an interval from the sample start time to the initial start time of the off-resonant interval, and accordingly using only a signal of TX may be insufficient to estimate a total amount of energy.

As a resonant duration becomes shorter in a sample, that is, as an off-resonant duration becomes longer in a sample, more information about a total amount of energy may be obtained. However, since a time at which an amount of energy stored in RX is a maximum occurs during mutual resonance, an amount of energy induced in RX may not be a maximum when a resonant duration is too short.

In FIGS. 10A and 10B, a turn-on time and turn-off time of $SW_{RX1}$ of FIG. 3 are each 50% of a total operating cycle of $SW_{RX1}$. That is, $SW_{RX1}$ is turned on 50% of the time, and turned off 50% of the time. In this case, a maximum interval during which a total amount of energy may be estimated extends from a sample start time to $T_{RX}/2$. That is, when the sample start time is included in the resonant interval, the maximum interval may correspond to the off-resonant interval.

As a result, a maximum amount of energy stored in TX, scanned per sample unit time $T_C$ during an interval of $0 \leq T \leq T_{RX}/2$ in one sample, equals a total amount of energy at each corresponding time shown in FIG. 9.

Also, since an off-resonant interval is not greater than $T_{RX}/2$, there is no need to estimate, in an interval of $T>T_{RX}/2$, a total amount of energy or a time when an amount of energy stored in RX is a maximum.

Figure 11:
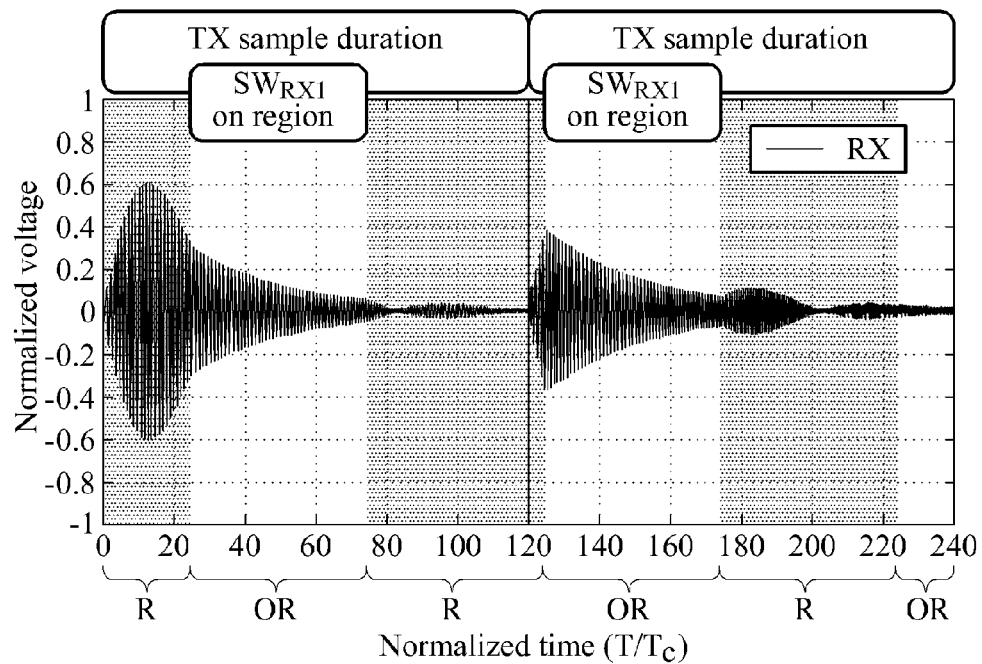
FIG. 11 is a graph illustrating an example of an amount of energy stored in a receiving end of a wireless energy transmission and reception system for a sample duration of energy transmitted from a transmitting end.

FIG. 11 is a graph illustrating an example of an amount of energy stored in a receiving end of a wireless energy transmission and reception system for a sample duration of energy transmitted from a transmitting end.

While $SW_{RX1}$ of FIG. 3 is turned on and off during a predetermined operating cycle $T_{RX}$, a source resonator is periodically supplied with energy at TX, and TX scans an amount of energy stored in the source resonator.

When a sample refers to a unit of energy supply from a power source, a sample length may be defined as $T_{Sample}=T_{RX}+sT_C$, where 's' denotes an integer greater than '0', and $T_C$ is defined as a smallest unit of time taken for a wireless energy transmission apparatus to process a signal. The number of samples increases with an increase in TX signal scanning time 't' starting from t=0. As a sample number N increases, an on time of $SW_{RX1}$ of FIG. 3 is moved up by $sT_C$ from a sample start time, that is, an energy supply time.

FIG. 11 illustrates an amount of energy stored in RX estimated at TX, for example, when $T_{RX}=100\ T_C$, $sT_C=20\ T_C$, and $T_{Sample}=120\ T_C$. When estimated at TX, an on time of $SW_{RX1}$ of FIG. 3 is advanced by 20 $T_C$ in a second sample corresponding to an interval between 120 $T_C$ and 240 $T_C$ compared to a first sample corresponding to an interval between 0 $T_C$ and 120 $T_C$. In FIG. 11, scanning is performed at a time earlier by 20 $T_C$ in each sample. Also, when the number of samples is $T_{RX}/sT_C$=5, scanning is performed during five samples. Accordingly, when s=1, scanning may be performed during the maximum number of samples $N_{MAX}=T_{RX}/T_C$, so that the on time of $SW_{RX1}$ of FIG. 3 may be estimated more accurately.

Figure 12:
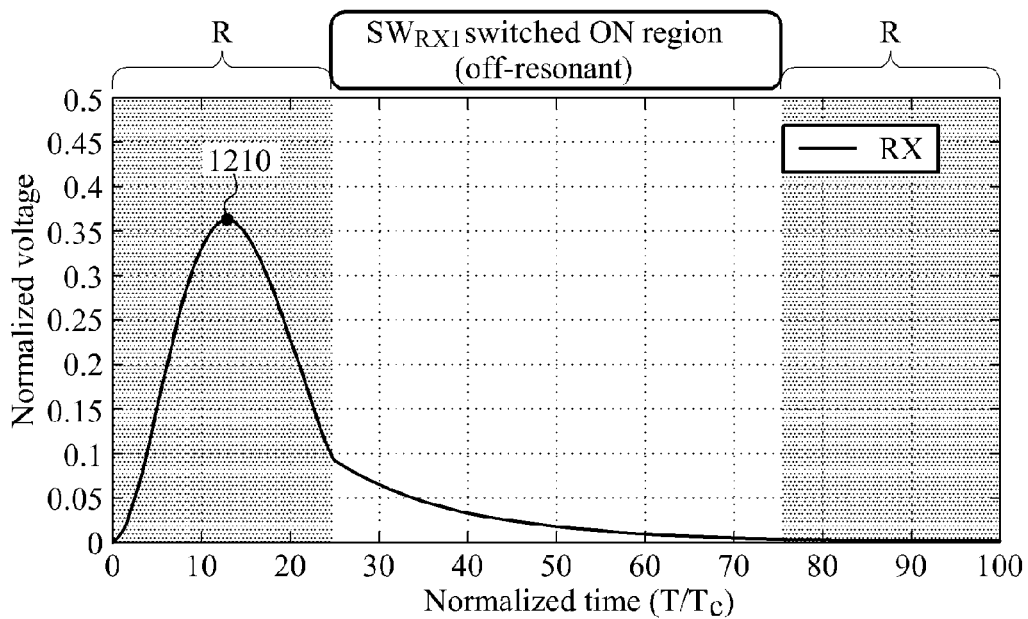
FIGS. 12 through 14 are graphs illustrating an example of an amount of energy induced in a wireless energy reception apparatus, estimated at a wireless energy transmission apparatus, for a duration of an arbitrary sample.
Figure 13:
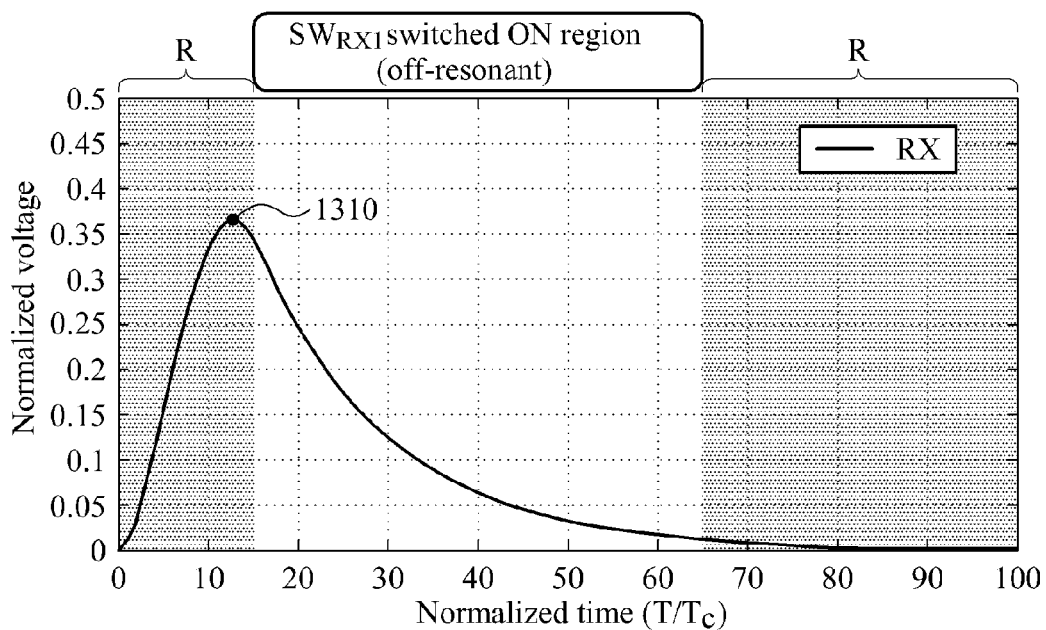
Figure 14:
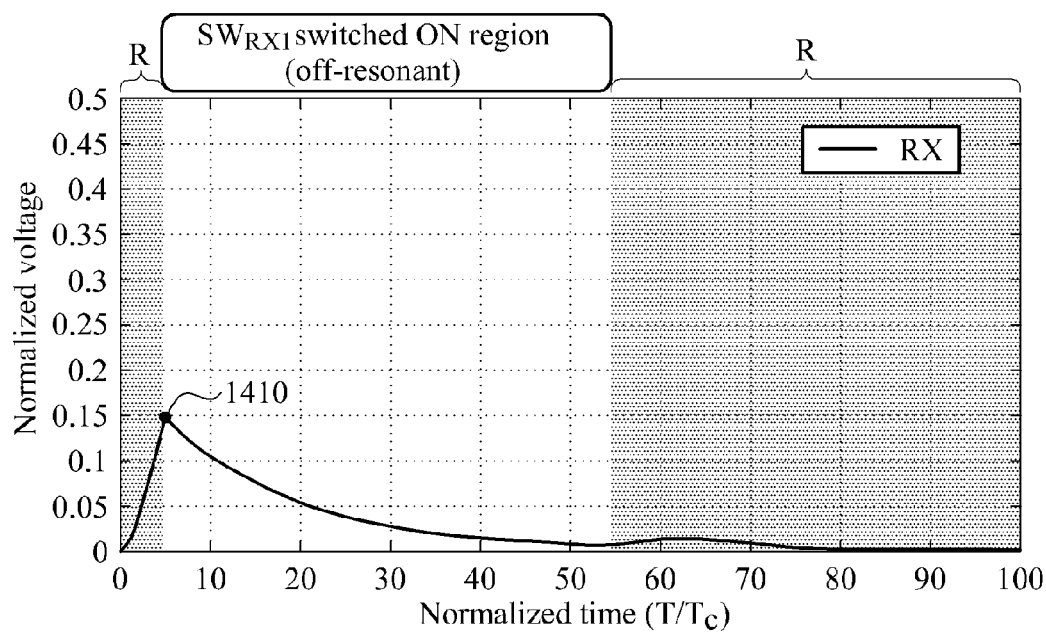

FIGS. 12 through 14 are graphs illustrating an example of an amount of energy induced in a wireless energy reception apparatus, estimated at a wireless energy transmission apparatus, for a duration of an arbitrary sample.

FIG. 12 illustrates an amount of energy induced in RX, estimated at TX, in an arbitrary sample. Referring to FIG. 12, a maximum amount 1210 of energy is induced in RX at 13 $T_0$. The maximum amount 1210 corresponds to an instantaneous maximum amount of energy transmission from TX in an arbitrary sample. R denotes a resonant interval.

FIG. 13 illustrates a tenth sample based on the time of FIG. 12. Referring to FIG. 13, a maximum amount 1310 is induced in RX at 13 $T_C$.

FIG. 14 illustrates a twentieth sample based on the time of FIG. 12. Referring to FIG. 14, a maximum amount 1410 is induced in RX at 5 $T_C$. A difference between the maximum amount 1310 in FIG. 13 and the maximum amount 1410 in FIG. 14 is caused by an off-resonant interval being moved up by $T_C$ per sample. As a resonant interval becomes longer, an amount of energy induced in RX may increase. This is because as an off-resonant interval becomes closer to a sample start time, a resonant interval becomes shorter and thus an amount of energy induced in RX decreases.

Figure 15:
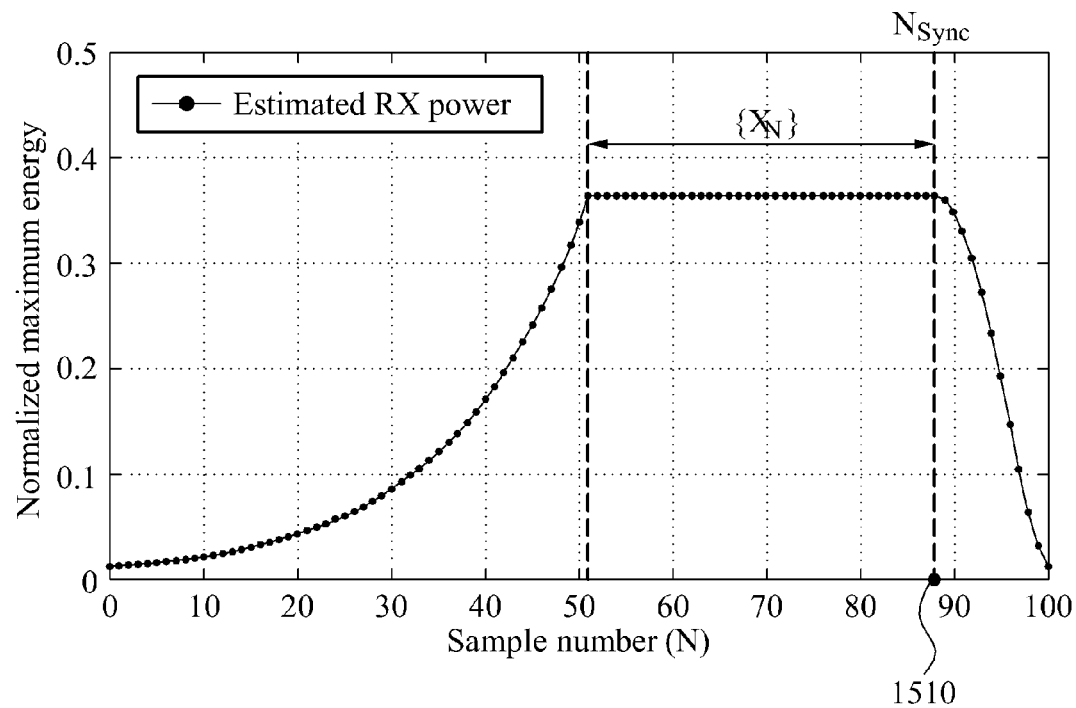
FIG. 15 is a graph illustrating an example of an amount of energy induced in a wireless energy reception apparatus, estimated at a wireless energy transmission apparatus, per sample.

FIG. 15 is a graph illustrating an example of an amount of energy induced in a wireless energy reception apparatus, estimated at a wireless energy transmission apparatus, per sample.

When a number of a sample scanned at TX is N ($0 \leq N < N_{MAX}$), a time in a sample is T ($0 \leq T < T_{Sample}$), and an amount of energy scanned at TX is $E_{TX}(t)$ ($0 \leq t < N_{MAX} * T_{Sample}$), a total amount of energy $E_{Total}(T)$ at the predetermined time T may be calculated using the following Equations 8 and 9.

$$E_{Sample}(T, N) = E_{TX}(T + NT_{Sample})(0 \leq T < T_{Sample}, 0 \leq N < N_{MAX}) \quad (8)$$

$$E_{Total}(T) = \max_{0 \leq N < N_{MAX}} E_{Sample}(T, N)(0 \leq T \leq T_{RX}/2) \quad (9)$$

In the above equations, $T_{Sample}=T_{RX}+T_C$, and $N_{MAX}=T_{RX}/T_C$. While an amount of energy is being scanned at TX, a maximum amount $M_{RX}(N)$ of energy induced in RX per sample may be calculated at TX using the following Equation 10.

$$M_{RX}(N) = \max_T [E_{Total}(T) - E_{Sample}(T, N)] \quad (10)$$

$M_{RX}(N)$ denotes an instantaneous maximum amount of energy transmission from TX to RX in an Nth sample.

FIG. 15 is a graph illustrating an estimated amount of energy induced in RX when $SW_{RX1}$ of FIG. 3 is active during mutual resonance between TX and RX.

An interval in which an amount of energy induced in a target resonator is absorbed at RX through a battery corresponds to an interval in which $SW_{RX1}$ of FIG. 3 is turned on, and is indicated as a non-hatched interval as shown in FIGS. 12 through 14.

For a maximum amount of energy induced in RX, a turn-on time of $SW_{RX1}$ of FIG. 3 needs to be synchronized with a time when an instantaneous amount of energy transmission from TX to RX is a maximum. The maximum amount of energy induced in RX may be uniformly maintained at 13 $T_C$ in samples of FIGS. 12 and 13. However, since the turn-on time of $SW_{RX1}$ of FIG. 3 is moved up in a sample of FIG. 14, the maximum amount of energy induced in RX is reduced.

Referring to FIG. 15, with the increasing sample number N, a maximum amount $M_{RX}(N)$ may be uniformly maintained during an interval $X_N$. In this interval, a sample immediately before the fall of a maximum amount $M_{RX}(N)$ corresponds to a sample $N_{Sync}$ in which the turn-on time of $SW_{RX1}$ of FIG. 3 is synchronized with a time 1510 when an instantaneous energy transmission amount of TX is a maximum. An operating time $t_{TX\_start}$ and an operating cycle $T_{TX}$ of a TX switch may be calculated based on the sample $N_{Sync}$ using the following Equations 11-14.

$$X_N = \left\{ N \, \Big| \, \max_{0 \leq n \leq N_{MAX}} (M_{RX}(n)) - M_{RX}(N) < m_{thr} \right\} \quad (11)$$

$$N_{Sync} = N \text{ s.t. } N \in X_N, N + 1 \in X_N^C \quad (12)$$

$$t_{TX\_start} = N_{Sync} T_{Sample} + k T_{RX} (k : \text{integer}) \quad (13)$$

$$T_{TX} = T_{RX} \quad (14)$$

In Equation 12, 's.t.' is an abbreviation for 'such that', and $X_N^C$ denotes the complement of $X_N$. The interval $X_N$ in which the maximum amount $M_{RX}(n)$ is maintained may be calculated using the maximum amount $M_{RX}(N)$ and a critical value $m_{thr}$. Using the last sample $N_{Sync}$ in the interval $X_N$, a period of time that has elapsed from a scan start time t=0 may be calculated at TX.

When an operating cycle $T_{TX}$ of TX equals an operating cycle $T_{RX}$ of RX based on the time elapsed in $N_{Sync} * T_{Sample}$ from the scan start time, an energy supply time $t_{TX\_start}$ in a subsequent sample may be synchronized with operation of $SW_{RX1}$ of FIG. 3. The energy supply time $t_{TX\_start}$ corresponds to a turn-off time of $SW_{TX}$ of FIG. 3.

Referring to FIG. 15, $N_{Sync}$=89, $T_{Sample}$=101 $T_C$, and $T_{RX}$=100 $T_C$. Since a time $t_{TX\_start}$ of energy supply to TX is (8989+100 k) $T_C$ from the above Equation 13, and a scan end time is $N_{MAX} * T_{Sample}$=10100 $T_C$, a time of initial energy supply to TX after synchronization corresponds to k=12, that is, 10189 $T_C$. Accordingly, in a synchronized state, an energy supply time to TX corresponds to {10189 $T_C$, 10289 $T_C$, 10389 $T_C$, 10489 $T_C$ ...} based on a scan start time. Whether $SW_{RX1}$ is active may be determined at TX using a distribution of the maximum amount $M_{RX}(N)$.

Figure 16:
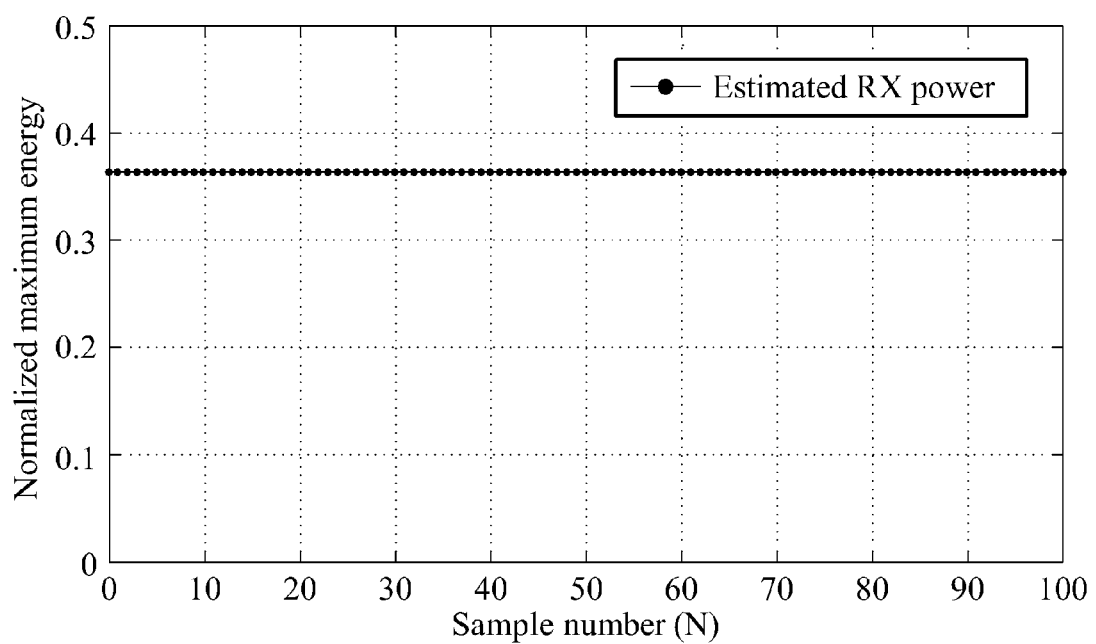
FIG. 16 is a graph illustrating an example of an amount of energy induced in a wireless energy reception apparatus when a switch of a receiving end of a wireless energy transmission and reception system is inactive.

FIG. 16 is a graph illustrating an example of an amount of energy induced in a wireless energy reception apparatus when a switch of a receiving end of a wireless energy transmission and reception system is inactive.

When $SW_{RX1}$ of FIG. 3 is inactive, i.e., turned off, during mutual resonance between TX and RX, a maximum amount $M_{RX}(N)$ may be uniformly maintained at a value greater than '0' as shown in FIG. 16. Whether $SW_{RX1}$ is inactive may be determined at TX using a distribution of the maximum amount $M_{RX}(N)$.

When data communication is not performed and only energy reception is performed at RX, $SW_{RX1}$ of FIG. 3 may be turned off to continuously maintain mutual resonance, and $SW_{RX2}$ of FIG. 3 may be turned on to allow a battery to continuously receive energy.

When an amount of energy stored in the battery of RX is insufficient for communication and when mutual resonance between TX and RX initially starts, RX controls $SW_{RX1}$ to be inactive.

When $SW_{RX1}$ does not operate, i.e., does not turn on, a maximum amount of $M_{RX}(N)$ does not change. Accordingly, a operating time $t_{TX\_start}$ and an operating cycle $T_{TX}$ of the TX switch are determined to be an arbitrary sample start time and a predetermined operating cycle without using the maximum amount $M_{RX}(N)$. The arbitrary sample start time may be expressed by the following Equation 15.

$$t_{TX\_start} = kT_{TX}(k:\text{integer}) \qquad (15)$$

When $SW_{RX1}$ does not operate and mutual resonance continuously occurs, an amount of energy induced in RX may be retransmitted to TX. Accordingly, to prevent energy from being retransmitted to TX and maintain a maximum possible amount of energy at RX, mutual resonance needs to be stopped by changing a resonant frequency of the source resonator at TX. The stopping of mutual resonance corresponds to off-resonance.

Figure 17:
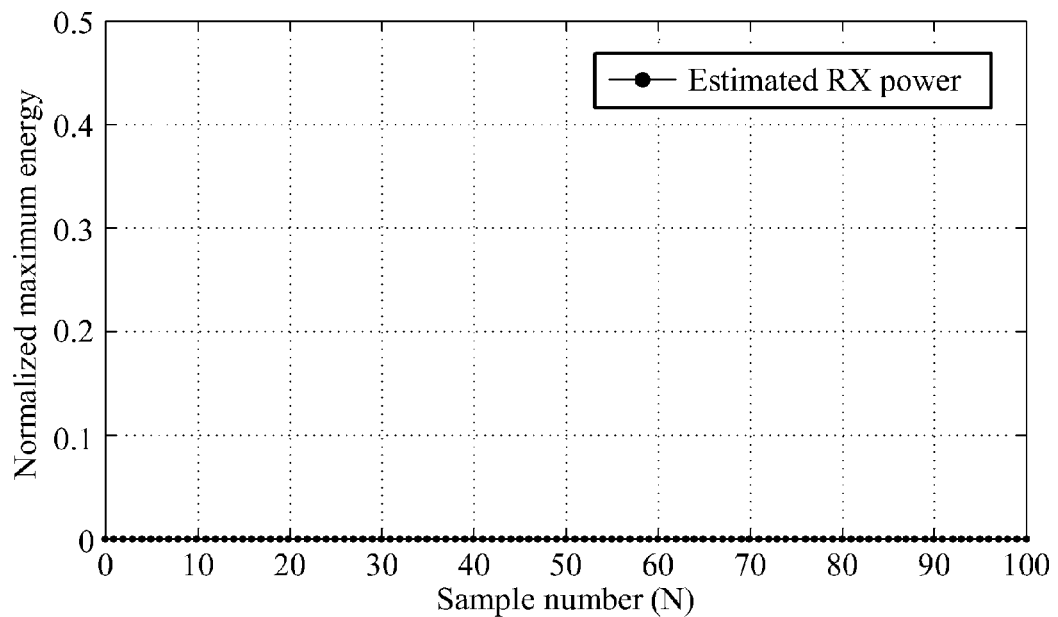
FIG. 17 is a graph illustrating an example of an amount of energy induced in a wireless energy reception apparatus when mutual resonance fails to occur due to absence of a receiving end of a wireless energy transmission and reception system.

FIG. 17 is a graph illustrating an example of an amount of energy induced in a wireless energy reception apparatus when mutual resonance fails to occur due to absence of a receiving end of a wireless energy transmission and reception system.

When self-resonance of TX occurs due to absence of RX within a distance allowing mutual resonance between RX and TX, a maximum amount $M_{RX}(N)$ always has a value of '0' as shown in the graph of FIG. 17.

When a maximum amount $M_{RX}(N)$ always has a value of '0', TX determines that RX is absent. The maximum amount $M_{RX}(N)$ may be repeatedly measured at TX to find an RX again after waiting for a predetermined period.

Figure 18:
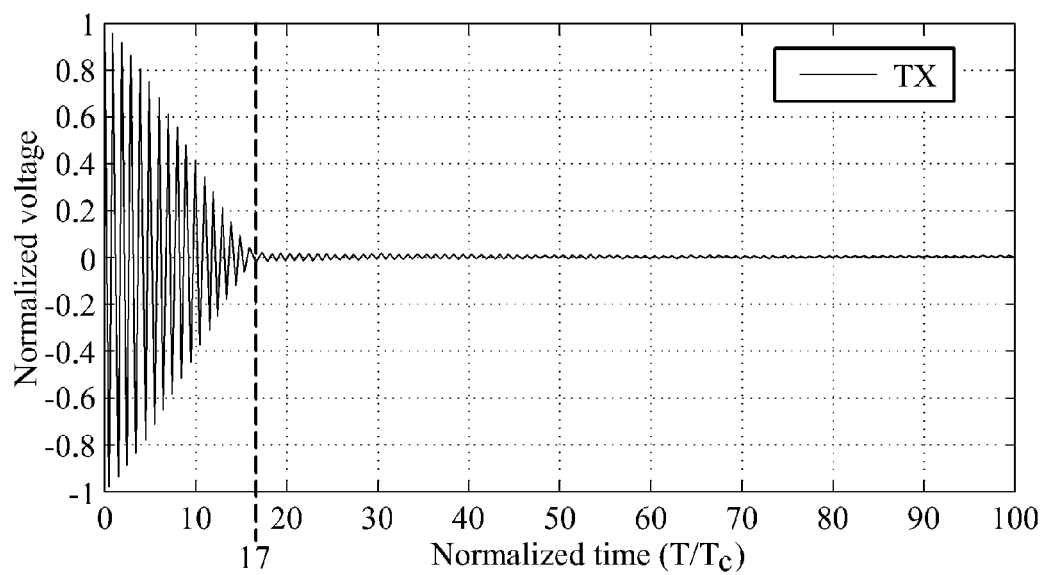

FIG. 18 is a graph illustrating an example of a change in energy at a transmitting end of a wireless energy transmission and reception system when off-resonance occurs due to a switch of the transmitting end being turned on. That is, FIG. 18 illustrates a voltage change of TX when $SW_{TX2}$ of FIG. 20 is turned on at a time $17\,T_C$ when an amount of energy stored in TX is a minimum. The voltage change of TX may be interpreted as an energy change. When $SW_{TX2}$ of FIG. 20 is turned on, a resonant frequency of a source resonator changes and mutual resonance stops. That is, off-resonance occurs.

Figure 19:
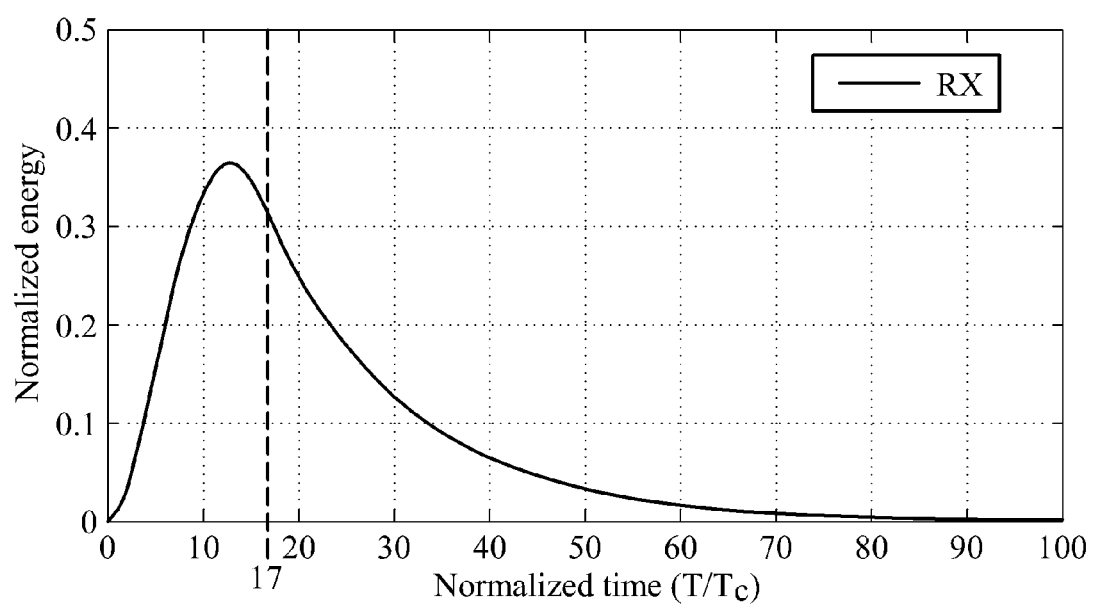

FIG. 19 is a graph illustrating an example of a change in energy at a receiving end of a wireless energy transmission and reception system when off-resonance occurs due to a switch of a transmitting end being turned on. That is, FIG. 19 illustrates an amount of energy stored in RX when $SW_{TX2}$ of FIG. 20 is turned on at a time $17\,T_C$ when an amount of energy stored in TX is a minimum. When $SW_{RX2}$ is turned on and a target resonator is connected to a load, the load is continuously supplied with energy from the target resonator, causing the energy stored in the target resonator to decrease over time as shown in FIG. 19.

FIG. 20 is a diagram illustrating another example of an equivalent circuit of a wireless energy transmission and reception system. Referring to FIG. 20, a switch $SW_{TX2}$ and an additional impedance 2030 are further provided in TX compared to the equivalent circuit in FIG. 3. When a source resonator 2010 is connected to the additional impedance 2030 through $SW_{TX2}$, a resonant frequency of the source resonator 2010 changes, and thus off-resonance occurs between the source resonator 2010 and a target resonator 2020. The additional impedance 2030 is shown as a device D, and the device D may include an inductor component and/or a capacitor component.

At $t_{TX\_start}$, $SW_{TX2}$ is turned off again and resonance reoccurs between TX and RX. Since an off-resonant time determined by $SW_{TX2}$ is determined to be a time at which an amount of energy remaining in TX is negligible, an energy transmission efficiency may be affected rather modestly. Accordingly, a component or material used for $SW_{TX2}$ and the device D may be more freely selected than $C_L$ of RX. When $SW_{TX2}$ is in a turn-off state during operation of $SW_{RX1}$, the wireless energy transmission and reception system has the same structure as the RI system of FIG. 3.

An off-resonant time $t_{off\_resonant}$ caused by turning $SW_{TX2}$ on needs only one sample, and corresponds to a time at which an amount of energy $E_{TX}$ stored in TX is a minimum during mutual resonance.

During mutual resonance, an amount of energy stored in TX may be '0' a plurality of times, and in this case, an earliest time is determined to be an off-resonant time as expressed by the following Equation 16.

$$t_{off\_resonant} = \min_t \left( \operatorname*{argmin}_{kT_{TX} \le t < (k+1)T_{TX}} E_{TX}(t) \right) \qquad (16)$$

Aside from a case in which an amount of energy stored in TX continues to be reduced for one cycle $T_{TX}$ and becomes '0', energy supply may be directly performed without off-resonance occurring. In this case, $SW_{TX2}$ may be maintained in an off state.

Figure 21:
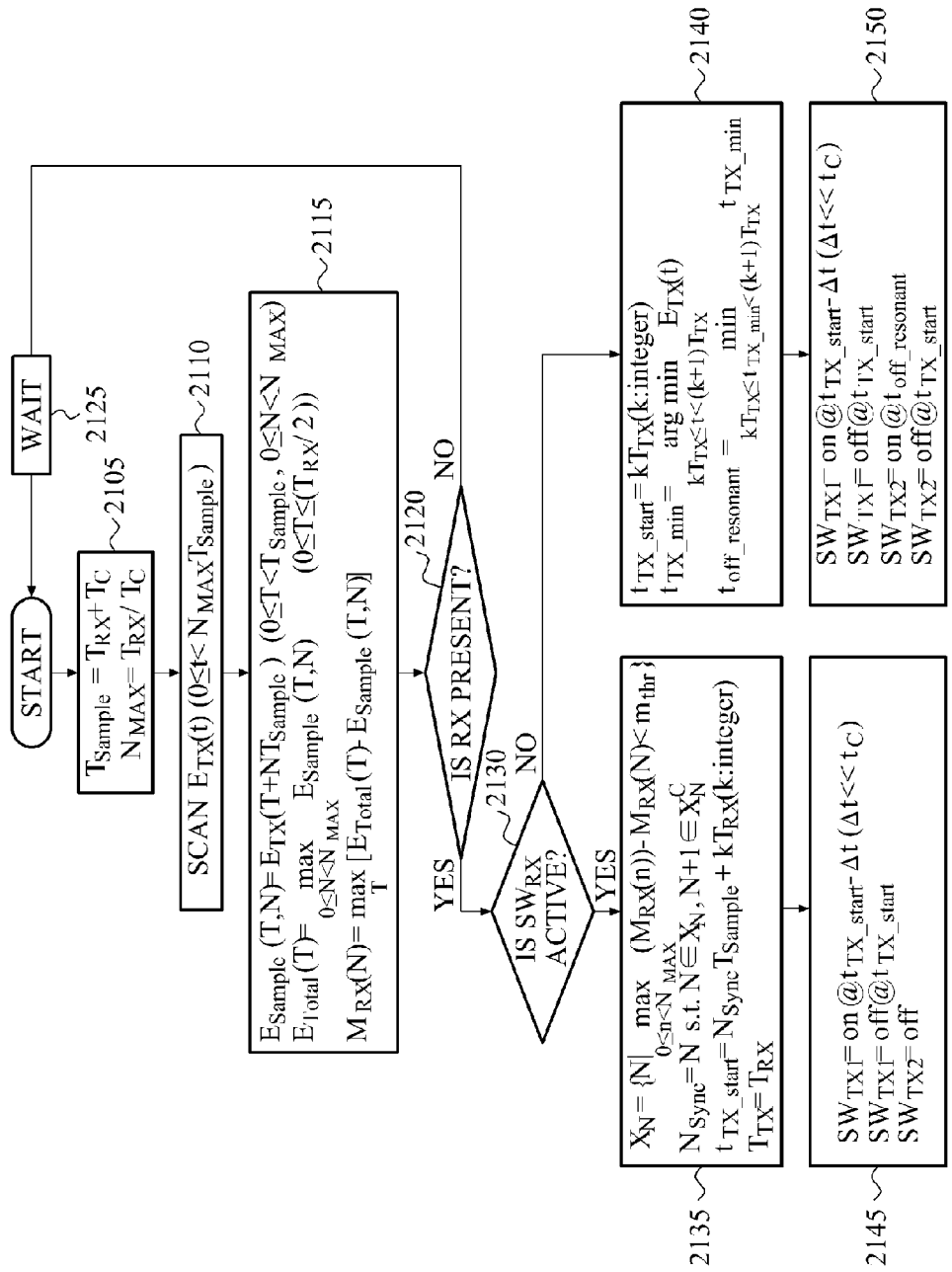
FIG. 21 is a flowchart illustrating an example of a wireless energy transmission method.

FIG. 21 is a flowchart illustrating an example of a wireless energy transmission method. In 2105, the wireless energy transmission apparatus determines the number of samples and a sample length. The sample length, the number of samples, and the maximum number of samples may be expressed by the following Equations 17-19.

$$T_{Sample} = T_{RX} + sT_C \qquad (17)$$

$$N = \frac{T_{RX}}{st_C} \qquad (18)$$

$$N_{MAX} = \frac{T_{RX}}{T_C} \qquad (19)$$

In Equations 17-19, $T_{RX}$ denotes an operating cycle of a receiving end switch, $T_C$ denotes a sample unit time, and 's' denotes an integer greater than '0'.

In 2110, the wireless energy transmission apparatus scans an amount of energy stored in TX. That is, the wireless energy transmission apparatus scans an amount of energy $E_{TX}(t)$ stored in a source resonator for a scanning period ($0 \le t < N_{MAX} * T_{Sample}$) corresponding to a predetermined number of samples each having a sample length.

In 2115, the wireless energy transmission apparatus calculates an amount of energy stored in the source resonator 401 per sample unit time of each sample based on the amount of scanned energy using the following Equation 20.

$$E_{Sample}(T,N) = E_{TX}(T + NT_{Sample})(0 \le T < T_{Sample},\\ 0 \le N < N_{Max}) \qquad (20)$$

The wireless energy transmission apparatus calculates, during an off-resonant interval, a greatest amount of energy among the amounts of energy calculated per sample using the following Equation 21, and determines the greatest amount of energy to be a total amount of energy stored in the source resonator and the target resonator at a predetermined time.

$$E_{Total}(T) = \max_{0 \leq N \leq N_{MAX}} E_{Sample}(T, N)(0 \leq T \leq T_{RX}/2) \quad (21)$$

The wireless energy transmission apparatus calculates, in each sample, an amount of energy having a greatest difference between the total amount of energy and the amount of energy stored in the source resonator using the following Equation 22, and estimates the calculated amount of energy to be an amount of energy induced in the target resonator.

$$M_{RX}(N) = \max_T [E_{Total}(T) - E_{Sample}(T, N)] \quad (22)$$

In 2120, the wireless energy transmission apparatus determines whether a wireless energy reception apparatus is present. The wireless energy reception apparatus corresponds to RX of a wireless energy transmission and reception system. The wireless energy transmission apparatus determines whether the wireless energy reception apparatus is present based on whether a maximum amount $M_{RX}(N)$ continuously maintains a value of '0'.

In 2125, when the wireless energy reception apparatus is determined to be absent, the wireless energy transmission apparatus waits for a predetermined period before performing another scan.

In 2130, when the wireless energy reception apparatus is determined to be present, the wireless energy transmission apparatus determines whether a switch $SW_{RX}$ of the wireless energy reception apparatus is active. The wireless energy transmission apparatus determines whether the switch $SW_{RX}$ of the wireless energy reception apparatus is active based on whether a maximum amount $M_{RX}(N)$ continuously has a value other than '0'.

In 2135, when the switch $SW_{RX}$ is determined to be active, the wireless energy transmission apparatus measures an interval in which a maximum amount of induced energy estimated per sample is maintained using the following Equation 23.

$$X_N = \left\{ N \;\middle|\; \max_{0 \leq n \leq N_{MAX}} (M_{RX}(n)) - M_{RX}(N) < m_{thr} \right\} \quad (23)$$

The wireless energy transmission apparatus determines an operating time of a transmitting end switch $SW_{TX1}$ based on a last sample and a length of the sample in the interval in which a maximum amount of energy is maintained. The last sample and the operating time of $SW_{TX1}$ may be expressed by the following Equations 24 and 25.

$$N_{Sync} = Ns.t. N \in X_N, N+1 \in X_N^C \quad (24)$$

$$t_{TX\_start} = N_{Sync} T_{Sample} + kT_{RX} (k:\text{integer}) \quad (25)$$

The wireless energy transmission apparatus determines an operating cycle of the transmitting end switch $SW_{TX1}$ to have the same value as an operating cycle of a receiving end switch $SW_{RX}$.

In 2140, when the switch $SW_{RX}$ is determined to be inactive, the wireless energy transmission apparatus determines the operating time $t_{TX\_start}$ of the transmitting end switch $SW_{TX1}$ to be an arbitrary sample start time using the following Equation 26, and determines the operating cycle of the transmitting end switch $SW_{TX1}$ to be a predetermined operating cycle.

$$t_{TX\_start} = kT_{TX}(k:\text{integer}) \quad (26)$$

The wireless energy transmission apparatus determines the operating time $t_{off\_resonant}$ of the transmitting end switch $SW_{TX2}$ to be a time at which an amount of energy scanned is a minimum using the following Equations 27 and 28.

$$t_{TX\_min} = \underset{kT_{TX} \leq t < (k+1)T_{TX}}{\arg\min} E_{TX}(t) \quad (27)$$

$$t_{off\_resonant} = t_{TX\_min} \quad (28)$$

When there are a plurality of instances at which an amount of energy scanned is a minimum, the wireless energy transmission apparatus determines an earliest time to be the operating time of the transmitting end switch $SW_{TX2}$ using the following Equation 29.

$$t_{off\_resonant} = \min_{kT_{TX} \leq t_{TX\_min} < (k+1)T_{TX}} (t_{TX\_min}) \quad (29)$$

In 2145, the wireless energy transmission apparatus turns on the transmitting end switch $SW_{TX1}$ at a time Δt earlier than the operating time $t_{TX\_start}$ of the transmitting end switch $SW_{TX1}$ to connect a source resonator to a power source to supply the source resonator with energy. Δt may be much less than a sample unit time $T_C$ so that a signal processing is not affected. The wireless energy transmission apparatus turns off the transmitting end switch $SW_{TX1}$ at the operating time $t_{TX\_start}$ to start mutual resonance. The transmitting end switch $SW_{TX2}$ is maintained in an off state.

In 2150, the wireless energy transmission apparatus turns on the transmitting end switch $SW_{TX1}$ at a time Δt earlier than the operating time $t_{TX\_start}$ of the transmitting end switch $SW_{TX1}$ to connect the source resonator to the power source to supply the source resonator with energy. Δt may be much less than a sample unit time $T_C$ so that a signal processing is not affected. The wireless energy transmission apparatus turns off the transmitting end switch $SW_{TX1}$ at the operating time $t_{TX\_start}$ of the transmitting end switch $SW_{TX1}$ to start mutual resonance. The wireless energy transmission apparatus turns on the transmitting end switch $SW_{TX2}$ at the operating time $t_{off\_resonant}$ of the transmitting end switch $SW_{TX2}$ to start off-resonance, and turns off the transmitting end switch $SW_{TX2}$ at the operating time $t_{TX\_start}$ of the transmitting end switch $SW_{TX1}$ to start mutual resonance.

Figure 22:
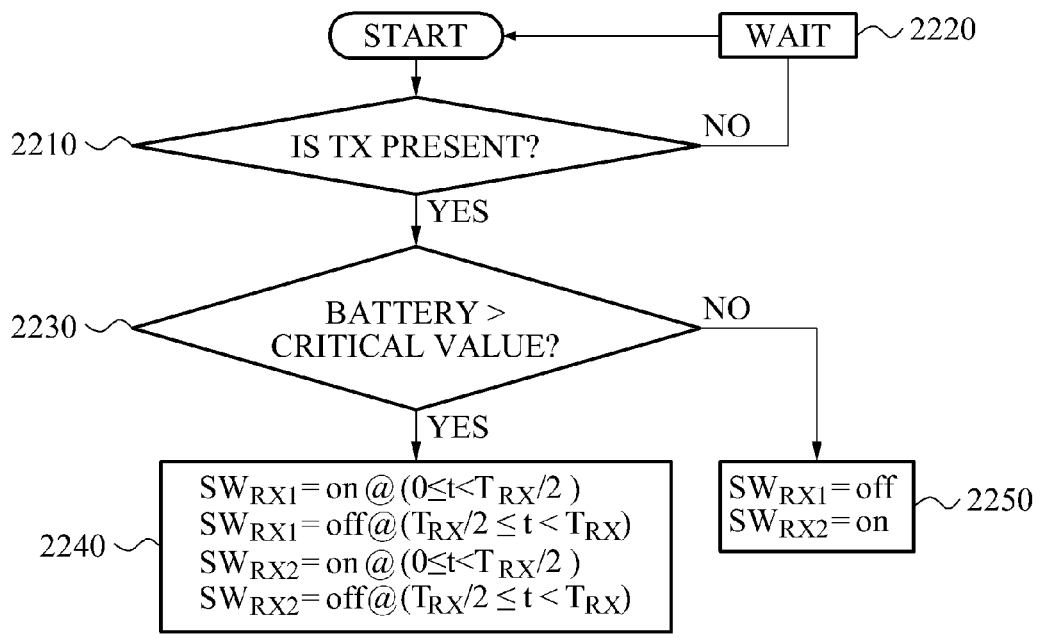
FIG. 22 is a flowchart illustrating an example of a wireless energy reception method.

FIG. 22 is a flowchart illustrating an example of a wireless energy reception method. In 2210, the wireless energy reception apparatus determines whether a wireless energy transmission apparatus is present based on whether an amount of energy is stored in a target resonator.

In 2220, when the wireless energy transmission apparatus is determined to be absent, the wireless energy reception apparatus waits for a predetermined period. After the wireless energy reception apparatus waits for a predetermined period, the wireless energy reception apparatus repeats operation 2210.

In 2230, when the wireless energy transmission apparatus capable of mutual resonance is determined to be present, the wireless energy reception apparatus determines whether a charging amount of a battery in the wireless energy reception apparatus is greater than a critical value.

In 2240, when the charging amount of the battery is determined to be greater than the critical value, the wireless energy reception apparatus turns on $SW_{RX1}$ in an off-resonant interval of ($0 \leq t < T_{RX}/2$) to connect a target resonator to an impedance changing a resonant frequency of the target resonator, and turns on $SW_{RX2}$ to connect the target resonator to the battery. In this case, 50% of a cycle of $SW_{RX1}$ is a turn-on time and the other 50% is a turn-off time.

In a resonant interval of $T_{RX}/2 \leq t < T_{RX}$, the wireless energy reception apparatus turns off $SW_{RX1}$ to disconnect the target resonator from the impedance changing the resonant frequency of the target resonator, and turns off $SW_{RX2}$ to disconnect the target resonator from the battery.

In 2250, when the charging amount of the battery is determined to be not greater than the critical value, the wireless energy reception apparatus turns off $SW_{RX1}$ to disconnect the target resonator from the impedance changing the resonant frequency of the target resonator, and turns on $SW_{RX2}$ to connect the target resonator to the battery to enable an amount of energy stored in the target resonator to be transmitted to the battery through continuous mutual resonance with a source resonator.

According to the examples described above, the operations necessary for synchronization between a transmitting end transmitting wireless energy and a receiving end receiving wireless energy may be processed at the transmitting end, so that energy consumed at the receiving end for synchronization may be saved.

According to the examples described above, the synchronization necessary for transmission and reception of energy and data between a transmitting end and a receiving end may be processed at the transmitting end, so that a control operation of the receiving end may be eased and a complex circuit of the receiving end may be simplified.

The switch unit 130, the switch unit 160, the control unit 220, the control unit 250, the scanning unit 410, the induced energy estimating unit 420, the transmitting end energy calculating unit 421, the total energy calculating unit 423, the receiving end energy estimating unit 425, the control unit 430, the measuring unit 431, the first determining unit 433, the second determining unit 435, the receiving unit 510, and the control unit 520 described above may be implemented using one or more hardware components, one or more software components, or a combination of one or more hardware components and one or more software components.

A hardware component may be, for example, a physical device that physically performs one or more operations, but is not limited thereto. Examples of hardware components include resistors, capacitors, inductors, power supplies, frequency generators, operational amplifiers, power amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A wireless energy transmission apparatus for wirelessly transmitting energy through resonance between a source resonator and a target resonator, the apparatus comprising:
   a scanning unit configured to scan an amount of energy stored in the source resonator for a scanning period; and
   an induced energy estimating unit configured to calculate a total amount of energy stored in the source resonator and the target resonator during an off-resonant interval between the source resonator and the target resonator based on the amount of energy scanned by the scanning unit, and estimate an amount of energy induced in the target resonator based on the amount of energy stored in the source resonator and the total amount of energy calculated.

2. The apparatus of claim 1, wherein the resonance between the source resonator and the target resonator is mutual resonance between the source resonator and the target resonator.

3. The apparatus of claim 1, wherein the scanning period corresponds to a number of samples and a sample length.

4. The apparatus of claim 3, wherein the induced energy estimating unit comprises:
   a transmitting end energy calculating unit configured to calculate the amount of energy stored in the source resonator per sample unit time for each of the samples based on the amount of energy scanned;
   a total energy calculating unit configured to calculate a greatest amount of energy among the amounts of energy calculated for each of the samples in the off-resonant interval, and determine the greatest amount of energy to be a total amount of energy stored in the source resonator and the target resonator at a predetermined time; and
   a receiving end energy estimating unit configured to estimate, for each of the samples, an amount of energy having a greatest difference between the total amount of energy calculated by the total energy calculating unit and the amount of energy stored in the source resonator calculated by the transmitting end energy calculating unit to be the amount of energy induced in the target resonator.

5. The apparatus of claim 4, further comprising a control unit configured to determine whether the target resonator is present and receiving energy from the source resonator based on a distribution of the amount of induced energy estimated for each of the samples by the receiving end energy estimating unit.

6. The apparatus of claim 5, wherein the control unit is further configured to determine whether a first receiving end switch configured to change a resonant frequency of the target resonator is active based on the distribution of the amount of induced energy estimated for each of the samples by the receiving end energy estimating unit.

7. The apparatus of claim 6, wherein the control unit is further configured to control operation of a first transmitting end switch to connect the source resonator to a power source configured to supply the source resonator with energy based on the amount of induced energy estimated for each of the samples by the receiving end energy estimating unit.

8. The apparatus of claim 7, wherein the control unit comprises:
   a measuring unit configured to measure an interval in which a maximum amount of induced energy estimated for each of the samples by the receiving end energy estimating unit is maintained when the first receiving end switch is determined to be active;
   a first determining unit configured to determine an operating time of the first transmitting end switch based on a last sample in the interval in which the maximum amount of induced energy is maintained and the sample length; and
   a second determining unit configured to determine an operating cycle of the first transmitting end switch to have a same value as an operating cycle of the first receiving end switch.

9. The apparatus of claim 8, wherein the control unit is further configured to:
   control the first transmitting end switch to connect the source resonator to the power source before the operating time of the first transmitting end switch determined by the first determining unit; and
   control the first transmitting end switch to disconnect the source resonator from the power source at the operating time of the first transmitting end switch.

10. The apparatus of claim 7, wherein the control unit comprises a first determining unit configured to determine an operating time of the first transmitting end switch to be an arbitrary sample start time, and an operating cycle of the first transmitting end switch to be a predetermined operating cycle, when the first receiving end switch is determined to be inactive.

11. The apparatus of claim 10, wherein the control unit further comprises a second determining unit configured to determine a time when the amount of energy scanned by the scanning unit is a minimum to be an operating time of a second transmitting end switch configured to change a resonant frequency of the source resonator.

12. The apparatus of claim 11, wherein the second determining unit is further configured to determine an earliest time the amount of energy scanned is a minimum to be the operating time of the second transmitting end switch when there are a plurality of times the amount of energy scanned is a minimum.

13. The apparatus of claim 11, wherein the control unit is further configured to:
   control the first transmitting end switch to connect the source resonator to the power source before the operating time of the first transmitting end switch determined by the first determining unit;
   control the first transmitting end switch to disconnect the source resonator from the power source at the operating time of the first transmitting end switch;
   control the second transmitting end switch to disconnect the source resonator from an impedance configured to change the resonant frequency of the source resonator at the operating time of the first transmitting end switch; and
   control the second transmitting end switch to connect the source resonator to the impedance configured to change the resonant frequency of the source resonator at the operating time of the second transmitting end switch determined by the second determining unit.

14. The apparatus of claim 3, wherein a value obtained by adding an operating cycle of a first receiving end switch configured to change a resonant frequency of the target resonator to an integer multiple of a sample unit time is determined to be the sample length; and
   a value obtained by dividing the operating cycle of the first receiving end switch by the integer multiple of the sample unit time is determined to be the number of samples.

15. A wireless energy transmission apparatus comprising a source resonator configured to wirelessly transmit energy to and receive energy from a target resonator through resonance between the source resonator and the target resonator, the apparatus comprising:
   a scanning unit configured to scan an amount of energy stored in the source resonator for a scanning period; and
   a control unit configured to change a resonant frequency of the source resonator at a time when the amount of energy scanned reaches a predetermined reference value.

16. The apparatus of claim 15, wherein the resonance between the source resonator and the target resonator is mutual resonance between the source resonator and the target resonator.

17. The apparatus of claim 15, wherein the scanning period corresponds to a number of samples;
   the scanning unit is further configured to scan the amount of energy stored in the source resonator for each of the samples; and
   the control unit is further configured to change a resonant frequency of the source resonator at a time when the amount of energy scanned for each of the samples reaches a predetermined reference value.

18. The apparatus of claim 17, wherein the control unit is further configured to change the resonant frequency of the source resonator at an earliest time the amount of energy scanned reaches the predetermined reference value when the amount of energy scanned reaches the predetermined reference value a plurality of times in one sample.

19. A wireless energy reception apparatus comprising:
   a receiving unit configured to receive wireless energy from a source resonator through resonance between the source resonator and a target resonator; and
   a control unit configured to determine whether the source resonator is present based on whether the receiving unit receives the wireless energy, and control operation of a first receiving end switch and a second receiving end switch by determining whether an amount of energy stored in a load is less than a predetermined threshold.

20. The apparatus of claim 19, wherein the resonance between the source resonator and the target resonator is mutual resonance between the source resonator and the target resonator.

21. The apparatus of claim 19, wherein when the amount of energy stored in the load is greater than the predetermined threshold, the control unit is further configured to:
   control, during an off-resonant interval, the first receiving end switch to connect the target resonator to an impedance configured to change a resonant frequency of the target resonator, and control the second receiving end switch to connect the target resonator to the load; and
   control, during a resonant interval, the first receiving end switch to disconnect the target resonator from the impedance configured to change the resonant frequency of the target resonator, and control the second receiving end switch to disconnect the target resonator from the load.

22. The apparatus of claim 19, wherein when the amount of energy stored in the load is less than or equal to the predetermined threshold, the control unit is further configured to control the first receiving end switch to disconnect the target resonator from the impedance configured to change the resonant frequency of the target resonator, and control the second receiving end switch to connect the target resonator to the load.

23. A wireless energy transmission method for wirelessly transmitting energy through resonance between a source resonator and a target resonator, the method comprising:
   scanning an amount of energy stored in the source resonator for a scanning period;
   calculating a total amount of energy stored in the source resonator and the target resonator during an off-resonant interval between the source resonator and the target resonator based on the amount of energy scanned; and
   estimating an amount of energy induced in the target resonator based on the amount of energy stored in the source resonator and the total amount of energy calculated.

24. The method of claim 23, wherein the resonance between the source resonator and the target resonator is mutual resonance between the source resonator and the target resonator.

25. The method of claim 23, wherein the scanning period corresponds to a number of samples and a sample length.

26. The method of claim 25, wherein the estimating of the amount of energy comprises:
   calculating the amount of energy stored in the source resonator per sample unit time for each of the samples based on the amount of energy scanned;
   calculating a greatest amount of energy among the amounts of energy calculated for the samples in the off-resonant interval;
   determining the greatest amount of energy to be a total amount of energy stored in the source resonator and the target resonator at a predetermined time; and estimating, for each of the samples, an amount of energy having a greatest difference between the total amount of energy calculated and the amount of energy stored in the source resonator to be an amount of energy induced in the target resonator.

27. A wireless energy transmission apparatus for wirelessly transmitting energy through resonance between a source resonator and a target resonator, the apparatus comprising:

an induced energy estimating unit configured to estimate an amount of energy induced in the target resonator during the resonance between the source resonator and the target resonator; and a control unit configured to synchronize an operation of a transmitting end switch configured to connect the source resonator to a power source configured to supply power to the source resonator with an operation of a receiving end switch configured to connect the target resonator to a load based on the estimated amount of energy induced in the target resonator.

28. The apparatus of claim 27, wherein the resonance between the source resonator and the target resonator is mutual resonance between the source resonator and the target resonator.

29. The apparatus of claim 27, wherein the control unit is further configured to:

determine an interval in which the estimated amount of energy induced in the target resonator is a maximum;

determine an operating time of the transmitting end switch based on an elapsed time between a start time of the determining of the interval and an end of the interval; and determine a length of an operating cycle of the transmitting end switch to be equal to a length of an operating cycle of the receiving end switch.

30. The apparatus of claim 27, wherein the control unit is further configured to synchronize the operation of the transmitting end switch with an operation of a receiving end switch configured to change a resonant frequency of the target resonator based on the estimated amount of energy induced in the target resonator.

* * * * *